(12) United States Patent
Sun et al.

(10) Patent No.: US 10,162,080 B2
(45) Date of Patent: *Dec. 25, 2018

(54) METHOD FOR PREDICTING FLUID FLOW

(71) Applicant: ExxonMobil Upstream Research Company, Spring, TX (US)

(72) Inventors: Tao Sun, Missouri City, TX (US); Dachang Li, Katy, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 274 days.

This patent is subject to a terminal disclaimer.

(21) Appl. No.: 14/692,474

(22) Filed: Apr. 21, 2015

(65) Prior Publication Data

US 2015/0227655 A1    Aug. 13, 2015

Related U.S. Application Data

(63) Continuation of application No. 13/201,395, filed as application No. PCT/US2010/021641 on Jan. 21, 2010, now Pat. No. 9,128,212.

(Continued)

(51) Int. Cl.
G01V 99/00 (2009.01)
G06F 17/10 (2006.01)
G06F 17/50 (2006.01)

(52) U.S. Cl.
CPC ............ *G01V 99/00* (2013.01); *G01V 99/005* (2013.01); *G06F 17/10* (2013.01); *G06F 17/5009* (2013.01)

(58) Field of Classification Search
None
See application file for complete search history.

(56) References Cited

U.S. PATENT DOCUMENTS 4,357,660 A    11/1982 Hepp
5,032,794 A    7/1991 Ridd et al.
(Continued)

FOREIGN PATENT DOCUMENTS

EP    1 837 683    9/2007
EP    1 435 527    4/2009
(Continued)

OTHER PUBLICATIONS

U.S. Geological Survey, "Standards for Digital Elevation Models", U.S. Department of the Interior (hereinafter USGS), 1998, 70 pages.*

(Continued)

*Primary Examiner* — Omar F Fernandez Rivas
*Assistant Examiner* — Herng-Der Day
(74) *Attorney, Agent, or Firm* — ExxonMobil Upstream Research Comapny-Law Department

(57) ABSTRACT

A method of enhancing a geologic model of a subsurface region is provided. A bed topography of the subsurface region is obtained. The bed topography is defined by a plurality of cells with an elevation associated with each cell center. The bed topography is represented as a cell-centered piecewise constant representation based on the elevations associated with the cells. The bed topography is reconstructed to produce a spatially continuous surface. Flux and gravitational force-related source terms are calculated based on the reconstructed bed topography. Fluxes are calculated between at least two of the cells. Fluid flow, deposition of sediments onto the bed, and/or erosion of sediments from the bed are predicted using the fluxes and gravitational force-related source terms. The predictions are inputted into the geologic model to predict characteristics of the subsurface region, and the predicted characteristics are outputted.

18 Claims, 8 Drawing Sheets

Related U.S. Application Data

(60) Provisional application No. 61/170,896, filed on Apr. 20, 2009.

(56) References Cited

U.S. PATENT DOCUMENTS

| | | | |
|---|---|---|---|
| 5,838,634 | A | 11/1998 | Jones et al. |
| 5,844,799 | A | 12/1998 | Joseph et al. |
| 5,995,906 | A | 11/1999 | Doyen et al. |
| 6,044,328 | A | 3/2000 | Murphy et al. |
| 6,070,125 | A | 5/2000 | Murphy et al. |
| 6,205,402 | B1 | 3/2001 | Lazaar et al. |
| 6,246,963 | B1 | 6/2001 | Cross et al. |
| 6,249,746 | B1 | 6/2001 | Neff et al. |
| 6,381,543 | B1 | 4/2002 | Guerillot et al. |
| 6,480,790 | B1 | 11/2002 | Calvert et al. |
| 6,549,853 | B2 | 4/2003 | Chakraborty et al. |
| 6,674,432 | B2 | 1/2004 | Kennon et al. |
| 6,754,588 | B2 | 6/2004 | Cross et al. |
| 6,885,941 | B2 | 4/2005 | Deffenbaugh et al. |
| 6,941,255 | B2 | 9/2005 | Kennon et al. |
| 7,006,951 | B2 | 2/2006 | Pond, Jr. et al. |
| 7,027,964 | B2 | 4/2006 | Kennon |
| 7,043,367 | B2 | 5/2006 | Granjeon |
| 7,043,413 | B2 | 5/2006 | Ward et al. |
| 7,062,383 | B2 | 6/2006 | Deffenbaugh et al. |
| 7,079,953 | B2 | 6/2006 | Thorne |
| 7,117,091 | B2 | 10/2006 | Masson et al. |
| 7,123,258 | B2 | 10/2006 | Deny et al. |
| 7,149,671 | B2 | 12/2006 | Lim et al. |
| 7,260,508 | B2 | 8/2007 | Lim et al. |
| 7,277,387 | B2 | 10/2007 | Minton, Jr. |
| 7,292,241 | B2 | 11/2007 | Thore et al. |
| 7,331,385 | B2 | 2/2008 | Symington et al. |
| 7,337,069 | B2 | 2/2008 | Masson et al. |
| 7,340,385 | B2 | 4/2008 | James |
| 7,363,158 | B2 | 4/2008 | Stelting et al. |
| 7,369,973 | B2 | 5/2008 | Kennon et al. |
| 7,392,136 | B2 | 6/2008 | Salles et al. |
| 7,433,784 | B2 | 10/2008 | Deffenbaugh et al. |
| 7,433,785 | B2 | 10/2008 | Deffenbaugh et al. |
| 7,516,055 | B2 | 4/2009 | Strebelle |
| 7,617,082 | B2 | 11/2009 | Childs et al. |
| 7,630,517 | B2 | 12/2009 | Mirowski et al. |
| 7,631,691 | B2 | 12/2009 | Symington et al. |
| 7,736,819 | B2 | 6/2010 | Masson et al. |
| 7,742,875 | B2 | 6/2010 | Li et al. |
| 7,904,248 | B2 | 3/2011 | Li et al. |
| 7,933,757 | B2 | 4/2011 | Awwiller |
| 7,953,585 | B2 | 5/2011 | Gurpinar et al. |
| 8,027,517 | B2 | 9/2011 | Gauthier et al. |
| 8,065,088 | B2 | 11/2011 | Dorn et al. |
| 8,117,019 | B2 | 2/2012 | Sun et al. |
| 8,271,244 | B2 | 9/2012 | Ross |
| 8,311,779 | B2 | 11/2012 | Pedersen et al. |
| 8,355,898 | B2 | 1/2013 | Pyrcz et al. |
| 8,370,121 | B2 | 2/2013 | Sun et al. |
| 8,452,580 | B2 | 5/2013 | Strebelle |
| 8,596,355 | B2 | 12/2013 | Kaminsky et al. |
| 8,612,195 | B2 | 12/2013 | Sun et al. |
| 8,825,461 | B2 | 9/2014 | Sun et al. |
| 8,855,987 | B2 | 10/2014 | Imhof et al. |
| 9,128,212 | B2 * | 9/2015 | Sun .................. G01V 99/00 |
| 2006/0041409 | A1 | 2/2006 | Strebelle et al. |
| 2007/0219725 | A1 | 9/2007 | Sun et al. |
| 2007/0276604 | A1 | 11/2007 | Williams et al. |
| 2008/0015784 | A1 | 1/2008 | Dorn et al. |
| 2009/0164182 | A1 | 6/2009 | Pedersen et al. |
| 2009/0312995 | A1 | 12/2009 | Pyrcz et al. |
| 2011/0308811 | A1 | 12/2011 | Ghayour et al. |
| 2012/0221306 | A1 | 8/2012 | Hurley et al. |
| 2012/0239361 | A1 | 9/2012 | Vargas-Guzman |
| 2012/0257477 | A1 | 10/2012 | Aqrawi et al. |

FOREIGN PATENT DOCUMENTS

| | | |
|---|---|---|
| WO | WO 2005/106537 | 11/2005 |
| WO | 2008/005690 | 1/2008 |
| WO | WO 2008/005690 | 1/2008 |
| WO | 2009/020715 | 2/2009 |
| WO | 2009/138290 | 11/2009 |
| WO | WO 2009/138290 | 11/2009 |
| WO | WO 2009/002715 | 12/2009 |
| WO | 2011/073861 | 6/2011 |

OTHER PUBLICATIONS

Valiani et al., "Finite Volume Scheme for 2D Shallow-Water Equations Application to the Malpasset Dam-Break", http://eportfolio.lib.ksu.edu.tw/~T097000001/repository/fetch/Valiani_1999.pdf, pp. 63-94.*

Valiani et al., "Finite Volume Scheme for 2D Shallow-Water Equations Application to a Flood Event in the Toce River", Proceedings of the 4th CADAM meeting, Nov. 1999, pp. 185-206.*

Lai, "Theory and User Manual for SRH-W Version 1.1 Sedimentation and River Hydraulics—Watershed model", U.S. Department of the Interior, Bureau of Reclamation, Nov. 2006, 151 pages.*

Reclamation Managing Water in the West Theory and User Manual for SRH-W, Verison 1.1 Sedimentation and River Hydraulic—Watershed, *U.S. Department of the Interior Bureau of Reclamation*, Nov. 2006.

Standard for Digital Elevation Models, National Mapping Program Technical Instructions, Part 2 Specifications, *U.S. Department of the Interior U.S. Geological Survey, National Mapping Division*, Oct. 1995.

Systems Manual of Basement, Dec. 2008.

The Wikipedia Article "Godunov's Scheme", Apr. 9, 2009 (http://en.wikipedia.org/wiki/Godunov%27s_scheme).

Arbogast, T, et al., Logically Rectangular Mixed Methods for Flow in Irregular, Heterogeneous Domains, *Proceedings of the International Conference on Computational Methods in Water Resources*, 11, vol. 1, pp. 621-628, 1996.

Begnudelll, Lorenzo, et al., Adaptive Godunov-Based Model for Flood Simulation, *Journal of Hydraulic Engineering ASCE*, pp. 714-725, Jun. 2008.

Caleffi, V., et al., Finite Volume Method for Simulating Extreme Flood Events in Natural Channels, *Journal of Hydraulic Research*, vol. 41, No. 2, pp. 167-177, 2003.

Cao, Shunhua, et al., Finite-Difference Solution of the Eikonal Equation Using an Efficient, First-Arrival, Waverfrost Tracking Scheme, *Geophysics*, 59; 4, pp. 632-643, 1994.

Duan, Taizhong, et al., 3-D Carbonate Stratigraphic Model Based on Energy and Sediment Flux, Annual Meeting Expanded Abtracts—*American Association of Petroleum Geologists*, pp. 43, 2000.

Eymard, R., et al., Convergence of a Numerical Scheme for Stratigraphic Modeling, *SIAM Journal on Numerical Analysis* (2005), vol. 43, No. 2, pp. 474-501.

Fang, H.W., et al., Diagonal Cartesian Method for the Numerical Simulation of Flow and Suspended Sediment Transport Over Complex Boundaries, *Journal of Hydraulic Engineering—ASCE*, vol. 132, No. 11 pp. 1195-1205, Nov. 2006.

Grasmeijer, B.T., et al., Modeling of Waves and Currents in the Nearshore Parametric vs. Probabilistic Approach *Coastal Engineering*, 49, 3, pp. 185-207, 2003.

Guo, et al., User's Guide to SEAWAT: A Computer Program for Simulation of Three-Dimensional Variable-Density Ground-Water Flow, *U.S. Geological Survey Techniques of Water-Resources Investigations*, 2002.

Harten, A., et al., On Upstream Differencing and Godunov-Type Scheme for Hyperbolic Conservation Laws, *Soc. Indus. Appl. Math. Rev.*, 25(1), pp. 35-61, 1987.

Hessel, Rudi, Effects of Grid Cell Size and Time Step Length on Simulation Results of the Limburg Soil Erosion Model, *Hydrological Processes*, vol. 19, 15, pp. 3037-3049, 2005.

(56) References Cited

OTHER PUBLICATIONS

Hirsch, C., (1990), Numerical Computation of Internal and External Flows, *Finite Volume Method and Conservative Discretization With an Introduction to Finite Element Method*, vol. 2, Chapter 5, pp. 203-248.

Kirkby, Mike, et al., The Influence of Land Use, Soils and Topography on the Delivery of Hillslope Runoff to Channels in SE Spain, *Earth Surface Processes and Landforms*, 27; 13, pp. 1459-1473, 2002.

Lin, E.T., et al., Application of 2-D EFA Model to Mobile-Bed River Simulation, *Proceedings of Congress of International Association of Hydraulic Research*, 30, Theme C/vol. 1; pp. 685-691, 2003.

Martin, Yvonne, et al., Testing Bedload Transport Formulae Suing Morphologic Transport Estimates and Field Data; Lower Fraser River, British Columbia, *Earth Surface Processes and Landforms*, 30; 10, pp. 1265-1285, 2005.

Neupauer, Roseanna M., et al., Numerical Implementation of a Backward Probabilistic Model of Ground Water Contamination, *Ground Water*, 42; 2, pp. 175-189, 2004.

Padmore, C.L., et al., Instream Habitat in Gravel-Bed Rivers; Indentification and Characterization of Boitopes, *International Gravel-Bed Rivers Workshop*, 4; pp. 345-364, 1998.

Parker, Gary, et al., Probabilistic Exner Sediment Continuity Equation for Mixtures With No Active Layer, *Journal of Hydraulic Engineering*, 126; 11, pp. 818-826, 2000.

Shi, Changxing, et al., Processes and Mechanisms of Dynamic Channel Adjustment to Delta Progradation; The Case of the Month Channel of the Yellow River, China, *Earth Surface Processes and Landforms*, 28; 6, pp. 609-624, 2003.

Tipper, John C, A Fractionation Model for Sediment Delivery, *Geological Society Special Publications*, 191, pp. 161-170, 2002.

Toro, E.F., Riemann Problems and the WAF Method for Solving Two Dimensional Shallow Water Equations, *Phil. Trans. Roy. Soc. London*, A338: pp. 43-68, 1992.

Toro, E.F., The Weighted Average Flux Method Applied to the Time-Dependent Euler Equations, *Phil. Trans. Roy. Soc. London*, A341: pp. 499-530, 1992.

\* cited by examiner

METHOD FOR PREDICTING FLUID FLOW

CROSS-REFERENCE TO RELATED APPLICATION

This application is a continuation of U.S. patent Ser. No. 13/201,395, which published as U.S. Patent Application Publication No. 20110290478 filed on Aug. 12, 2011, which is the National Stage of International Application No. PCT/US2010/021641 that published as Intl. Patent Application Publication No. 2010/123596, filed Jan. 21, 2010 which claims the benefit of U.S. Provisional Patent Application 61/170,896 filed 20 Apr. 2009 entitled METHOD FOR PREDICTING FLUID FLOW, the entirety of each of these application is incorporated herein by reference for all purposes.

TECHNICAL FIELD

Aspects of methodologies and techniques disclosed herein relate to methods for efficiently and accurately solving water flow and sediment transport equations numerically, which may be used to predict fluid flow and optimize production of hydrocarbon resources from geologic formations based on such predictions.

BACKGROUND OF THE DISCLOSURE

Numerical simulation is widely used in industrial fields as a method of simulating a physical system by using a computer. In most cases, there is a desire to model the transport processes occurring in the physical system. What is being transported is typically mass, energy, momentum, or some combination thereof. By using numerical simulation, it is possible to model and observe a physical phenomenon and to determine design parameters, without actual laboratory experiments and field tests.

The principle of numerical simulation is to numerically solve equations describing a physical phenomenon by a computer, such as fluid flow. Such equations are generally ordinary differential equations and partial differential equations. These equations are typically solved by linearizing the equations and using numerical methods such as the finite element method, the finite difference method, the finite volume method, and the like. In each of these methods, the physical system to be modeled is divided into smaller gridcells or blocks (a set of which is called a grid or mesh), and the state variables continuously changing in each gridcell are represented by sets of values for each gridcell. In the finite difference method, an original differential equation is replaced by a set of algebraic equations to express the fundamental principles of conservation of mass, energy, and/or momentum within each gridcell and transfer of mass, energy, and/or momentum transfer between gridcells. These equations can number in the millions. Such replacement of continuously changing values by a finite number of values for each gridcell is called "discretization." In order to analyze a phenomenon changing in time, it is necessary to calculate physical quantities at discrete intervals of time called timesteps, irrespective of the continuously changing conditions as a function of time. Time-dependent modeling of the transport processes proceeds in a sequence of timesteps. Many numerical schemes have been used for solving the partial differential equation, including for example the well known Godunov scheme. In the Godunov scheme, conservation variables are considered as piecewise constant over the mesh cells at each time step and the time evolution is determined by the exact solution of what is known as the Riemann problem. To reduce computation time, the changes in the model parameter values defined for individual grid cells are typically piecewise-constant within the cells rather than continuously varying.

The Wikipedia article "Godunov's Scheme" as accessed on Apr. 9, 2009 (http://en.wikipedia.org/wiki/Godunov%27s_scheme) describes Godunov's scheme as follows:

"In numerical analysis and computation fluid dynamics, Godunov's scheme is a conservation numerical scheme, suggested by S. K. Godunov in 1959, for solving partial differential equations. In this method, the conservative variables are considered as piecewise constant over the mesh cells at each time step and the time evolution is determined by the exact solution of the Riemann problem (shock tube) at the inter-cell boundaries (Hirsch, C. (1990), *Numerical Computation of Internal and External Flows*, vol 2, Wiley.).

Following Hirsch, the scheme involves three distinct steps to obtain the solution at $t=(n+1)\Delta t$ from the known solution at $t=n\Delta t$, as follows:

Step 1 Define piecewise constant approximation of the solution at $t=(n+1)\Delta t$. Since the piecewise constant approximation is an average of the solution over the cell of size $\Delta x$, the spatial error is of order $\Delta x$, and hence the resulting scheme will be first-order accurate in space. Note that this approximation corresponds to a finite volume method representation whereby the discrete values represent averages of the state variables over the cells. Exact relations for the averaged cell values can be obtained from the integral conservation laws.

Step 2 Obtain the solution for the local Riemann problem at the cell interfaces. This is the only physical step of the whole procedure. The discontinuities at the interfaces are resolved in a superposition of wave satisfying locally the conservation equations. The original Godunov method is based upon the exact solution of the Riemann problems. However, approximate solutions can be applied as an alternative.

Step 3 Average the state variables after a time interval $\Delta t$. The state variables obtained after Step 2 are averaged over each cell defining a new piecewise constant approximation resulting from the wave propagation during the time interval $\Delta t$. To be consistent, the time interval $\Delta t$ should be limited such that the waves emanating from an interface do not interact with waves created at the adjacent interfaces. Otherwise the situation inside a cell would be influenced by interacting Riemann problems. This leads to the CFL condition $|a_{max}|\Delta t<\Delta x/2$ where $|a_{max}|$ is the maximum wave speed obtained from the cell eigenvalue(s) of the local Jacobian matrix.

The first and third steps are solely of a numerical nature and can be considered as a projection stage, independent of the second, physical step, the evolution stage. Therefore, they can be modified without influencing the physical input, for instance by replacing the piecewise constant approximation by a piecewise linear variation inside each cell, leading to the definition of second-order space-accurate schemes, such as the MUSCL scheme."

In geologic modeling, a digital representation of the detail internal geometry and rock properties of a subsurface earth volume, such as a petroleum reservoir or a sediment-filled basin is built. In the oil and gas industry, geologic models provide geologic input to reservoir performance simulations which are used to select locations for new wells, estimate hydrocarbon reserves, plan reservoir-development strategies, and/or perform other hydrocarbon extraction activities. The spatial distribution of permeability is a key parameter in characterizing reservoir performance, and, together with other rock and fluid properties, determines the producibility of the reservoir. For sandstone reservoirs, the spatial distribution of permeability is a function of the grain-size distribution of sands which compose the reservoir, the compartmentalization of those sands by barriers of finer grained material, and the mineralogy and burial history of the reservoir.

Most geologic models built for petroleum applications are in the form of a three-dimensional array of model blocks (cells), to which geologic and/or geophysical properties such as lithology, porosity, acoustic impedance, permeability, and water saturation are assigned (such properties will be referred to collectively herein as "rock properties"). The entire set of model blocks represents the subsurface earth volume of interest. The goal of the geologic-modeling process is to assign rock properties to each model block in the geologic model.

The geologic modeling process can use many different data types, including but not limited to rock-property data obtained from cores, well logs, seismic data, well test and production data, and structural and stratigraphic surfaces that define distinct zones within the model. Other data types may include surface topographical data and aerial and satellite images that may be used to infer or predict subsurface geologic formations by observing and/or predicting similar geologic activities (erosion, deposition, fluid flow, sediment flow, etc.) on the earth's surface. In general, the resolution or spatial coverage of the available data is not adequate to uniquely determine the rock properties in every geologic model cell. Other assumptions about the variability in these properties are made in order to populate all model cells with reasonable property values. Geocellular techniques, object-based modeling, and process modeling are three main ways to populate the discretized geologic volume with properties.

In the geocellular approach, the relationship between properties in nearby cells is specified statistically. Geostatistical estimation methods (which may be either deterministic or probabilistic) are used to compute rock property values within cells. These methods take into account distance, direction, and spatial continuity of the rock property being modeled. Deterministic estimation methods commonly calculate a minimum-variance estimate of the rock property at each block. Probabilistic estimation methods develop distributions of the rock-property values and produce a suite of geologic model realizations for the rock property being modeled, with each realization theoretically being equally probable. The spatial continuity of a rock property may be captured by a variogram, a well-known technique for quantifying the variability of a rock property as a function of separation distance and direction. U.S. Pat. Nos. 5,838,634, 6,381,543 and 6,480,790 discuss geocellular modeling methods embodied in processing flows which include repetitive optimization steps to drive the geologic model toward conformance with geologic and geophysical data types such as wells, seismic surveys and subsurface fluid production and pressure data. Most commercial modeling software packages, including PETREL, GOCAD and STRATA-MODEL, contain a wide spectrum of geostatistical tools designed to fulfill the requirements of reservoir geologists and engineers. While these methods can readily accommodate data control points such as wells and geophysical constraints such as seismic data, they generally do not closely replicate the geologic structures observed in natural systems.

In the object-based approach, subsurface reservoir volumes are treated as assemblages of geologic objects with pre-defined forms such as channels and depositional lobes. U.S. Pat. No. 6,044,328 discloses one object-based modeling scheme that allows geologists and reservoir engineers to select geologic objects from an analog library to best match the reservoir being modeled. The appropriateness of the analog is judged by the operator of the process based on their geologic experience. Most commercial software packages including PETREL, IRAP-RMS and GOCAD implement objects as volumetric elements that mimic channels and lobes using simplified elements based on user deformable shapes such as half pipes and ellipses. Other examples of object-based models are the model depositional objects, such as a river belt and the braided stream network, are placed sequentially on top of each other according to some algorithms. While these models try to mimic the real depositional structures, they do not attempt to capture the physics of water flow and sediment transport that, over geologic time, determined the rock properties at a particular subsurface location.

Process-based models attempt to reproduce subsurface stratigraphy by building sedimentary deposits in chronological order relying to varying degrees on a model or approximation of the physical processes shaping the geology. Although process models are rarely used in current industrial practice, U.S. Pat. Nos. 5,844,799, 6,205,402 and 6,246,963 describe three such methods. These methods employ diffusion or rule-based process models to create basin-scale models with limited spatial detail inadequate for reservoir performance simulation. Another type of model is hydrodynamics-based gridding, which in one aspect may generate grid surfaces conforming to time surfaces during the process of sedimentation. Hydrodynamics-based gridding is the subject of U.S. patent application Ser. No. 11/629,822, "Method for Geologic Modeling Through Hydrodynamics-Based Gridding (Hydro-Grids)", having inventors Li et al. and filed Dec. 15, 2006.

Other types of process-based models that could potentially provide the most accurate representation of geologic structures are physics-based, process-based models. These models are based on basic physics of fluid flow and sediment transport, and build the subsurface stratigraphy by explicitly modeling the fluid flow, sediment transport, erosion and deposition that occurred during the formation of the reservoir. Compared with other types of geologic models, these physics-based process-based models can better preserve the spatial continuities of sedimentary body geometrics as well as flow baffles and barriers such as shale and mud deposits.

A component in the physics based process-based model is to solve the fluid flow and sediment transport equations. Often this involves solving shallow water or depth-averaged turbidity current equations. A problem in solving shallow-water and depth-averaged turbidity current equations using Godunov-type schemes is the imbalance between flux gradients and bed slope source terms due to the discretized representations of flow and the underlying topography. For stationary flow problems, an ideal variable reconstruction and flux integration scheme should produce a sum of normal components of flux terms evaluated at the edges of a computational cell that exactly balances bed slope source terms evaluated at the center of the cell, and should produce zero changes in flow momentums in the cell. In practice however, these two terms generally do not balance each other in most of the low resolution schemes, as well as in many high resolution schemes. The error introduced by the imbalance is often cumulative, and can significantly degrade the accuracies of the schemes, especially in locations where there are significant topographic variations and controls. An improved method of predicting fluid flow, thereby to improve production management of hydrocarbon resources, is desirable.

SUMMARY

A method of enhancing a geologic model of a subsurface region is provided. The method includes obtaining an initial bed topography of the subsurface region. The bed topography is defined by a plurality of cells. Each of the plurality of cells has an elevation associated with its cell center. The initial bed topography is represented as a cell-centered piecewise constant representation based on the elevations associated with the plurality of cells. The bed topography is reconstructed to produce a spatially continuous surface. Flux and gravitational force-related source terms are calculated based on the reconstructed bed topography. Fluxes are calculated between at least two of the cells taking into account variations of the bed topography across an interface between the at least two of the cells. Fluid flow, deposition of sediments onto the bed, and/or erosion of sediments from the bed are predicted using the fluxes and gravitational force-related source terms. The predicted fluid flow, deposition and/or erosion are inputted into the geologic model of the subsurface region. The geologic model is used to predict characteristics of the subsurface region. The predicted characteristics of the subsurface region are outputted.

The fluxes may be calculated to at least a first order of accuracy. Reconstructing the bed topography may comprise defining triangles by pairs of two consecutive cell vertices and an effective cell center. A fluid surface elevation may be reconstructed, and flux and gravitational force-related source terms may be calculated based on the reconstructed bed topography and the reconstructed fluid surface elevation. The fluid surface elevation may be reconstructed using a piecewise constant scheme or a piecewise linear scheme. Hydrocarbons may be extracted based on the outputted characteristics of the subsurface region. Outputting the predicted characteristics of the subsurface region may include displaying the predicted characteristics. Reconstructing the bed topography may conserve mass below and above the spatially continuous surface. Calculating fluxes between at least two of the cells may be performed according to the following equation:

$$\int_{-l_0}^{l_0} \bar{F}^*(l) \cdot n dl = 2l_0 \bar{f}^{*(0)} + \frac{2}{3}l_0(\bar{f}_3^* \hat{\Delta}_L^2 + \bar{f}_4^* \hat{\Delta}_R^2 + \bar{f}_5 \hat{\Delta}_L \hat{\Delta}_R)$$

wherein $\bar{F}^*(l)$ represents a flux per unit width between two cells at the location that is a distance l from a cell face middle line between the at least two of the cells, $\bar{n}$ represents a unit vector perpendicular to a boundary between the at least two of the cells on an unstructured grid, $l_0$ represents half of the length of the boundary between the at least two of the cells, $\bar{f}^{*(0)}$ represents a first expansion coefficient corresponding to a zeroth order flux per unit width at the center of the edge between the at least two of the cells, $\bar{f}^*_3$ represents a second expansion coefficient, $\hat{\Delta}_L^2$ represents the square of a dimensionless maximum fluid depth change in a first of the at least two of the cells, $\bar{f}^*_4$ represents a third expansion coefficient, $\hat{\Delta}_R^2$ represents the square of a dimensionless maximum fluid depth change in a second of the at least two of the cells, $\bar{f}^*_5$ represents a fourth expansion coefficient, $\hat{\Delta}_L$ represents a dimensionless maximum fluid depth change in the first of the at least two of the cells, and $\hat{\Delta}_R$ represents a dimensionless maximum fluid depth change in the second of the at least two of the cells. Piecewise constant cell elevations may be updated using the predicted fluid flow, deposition of sediments, and/or erosion of sediments, and the steps of obtaining, reconstructing, calculating flux and source terms, calculating fluxes, and predicting may be repeated to improve accuracy of fluid flow predictions. The predicted characteristics of the subsurface region may include at least one of sediment grain size distribution, porosity, and permeability. The plurality of elevations may represent conservative variables, which may be updated based on the calculated source terms.

In another aspect, a computer program product having computer executable logic recorded on a tangible, machine-readable medium is provided. The computer program product includes: code for obtaining a bed topography of a subsurface region, the bed topography defined by a plurality of cells, each of the plurality of cells having an elevation associated with its cell center; code for representing the bed topography as a cell-centered piecewise constant representation based on the elevations associated with the plurality of cells; code for reconstructing the bed topography to produce a spatially continuous surface; code for calculating flux and gravitational force-related source terms based on the reconstructed bed topography; code for calculating fluxes between at least two of the cells, taking into account variations of the bed topography across a face between the at least two of the cells; and code for predicting at least one of fluid flow, deposition of sediments onto the bed, and erosion of sediments from the bed using the fluxes and gravitational force-related source terms.

The fluxes may be calculated to at least a first order of accuracy. Code for reconstructing the bed topography may include code for defining triangles by pairs of two consecutive cell vertices and an effective cell center. Code may be provided for reconstructing a fluid surface elevation above the bed topography, and calculating flux and gravitational force-related source terms based on the reconstructed bed topography and the reconstructed fluid surface elevation. Code may be provided for managing production of hydrocarbon resources based on the prediction of the fluid flow. Code may be provided for outputting the predicted fluid flow, the deposition of sediments, or the erosion of sediments. Code may be provided for: inputting the predicted fluid flow, deposition and/or erosion into a geologic model of the subsurface region; predicting characteristics of the subsurface region using the geologic model; and outputting the predicted characteristics of the subsurface region.

In another aspect, a method of extracting hydrocarbons from a subsurface region is provided. According to the method, a bed topography of the subsurface region is obtained. The bed topography is defined by a plurality of cells, each of the plurality of cells having an elevation associated with its cell center. The bed topography is represented as a cell-centered piecewise constant representation based on the plurality of elevations. The bed topography is reconstructed to produce a spatially continuous surface. Flux and gravitational force-related source terms are calculated based on the reconstructed bed topography. Fluxes between at least two of the cells are calculated taking into account variations of the bed topography across a face between the at least two of the cells. At least one of fluid flow, deposition of sediments onto the bed, and erosion of sediments from the bed are predicted using the fluxes and gravitational force-related source terms. The presence of hydrocarbons in the subsurface region is predicted based at least in part on the predicted fluid flow, deposition of sediments, or erosion of sediments. Hydrocarbons are extracted from the subsurface region.

BRIEF DESCRIPTION OF THE DRAWINGS

Advantages will be better understood by referring to the following detailed description and the attached drawings, in which.

DETAILED DESCRIPTION

Figure 1:
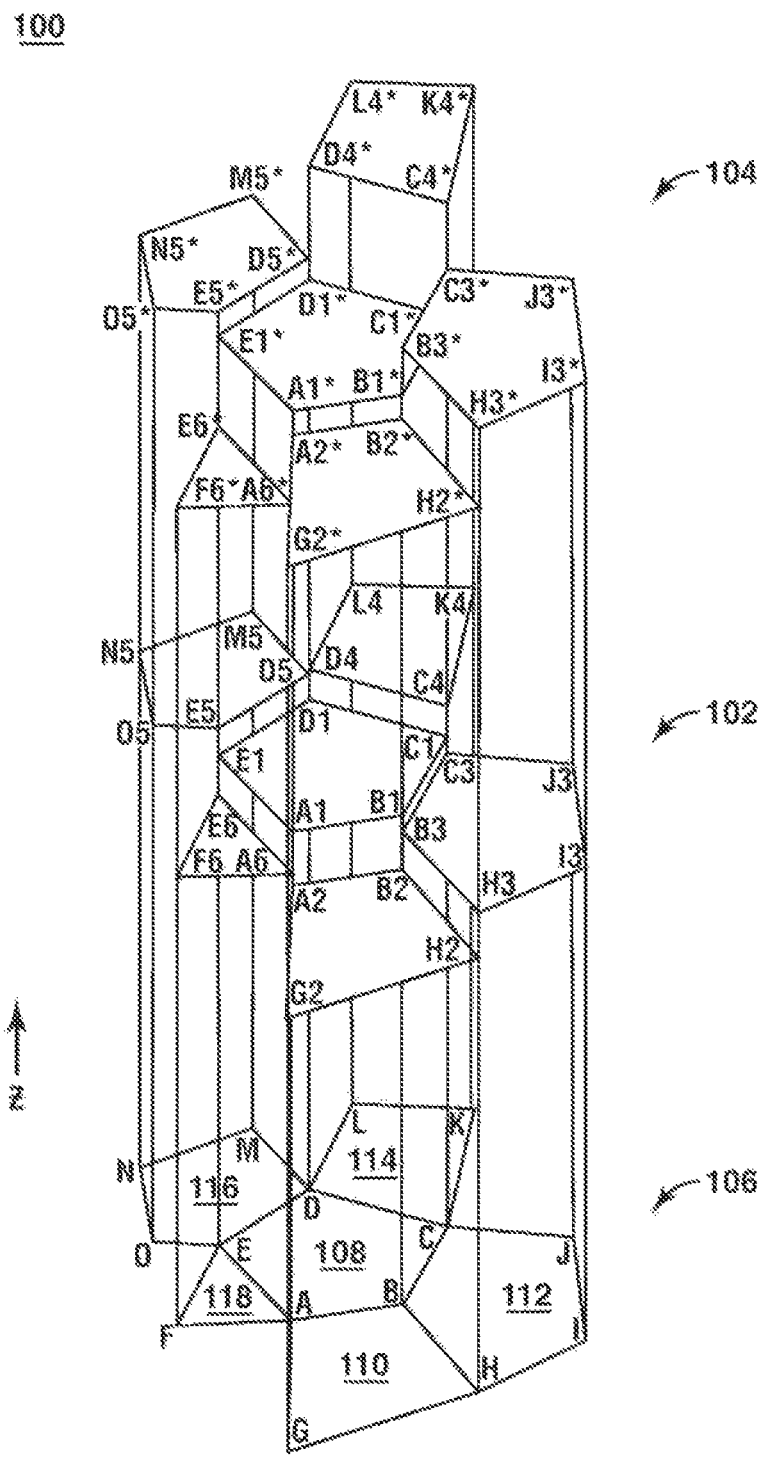
FIG. 1 is a diagram of a bed topography, a fluid surface elevation and an unstructured grid.

Some portions of the detailed description which follows are presented in terms of procedures, steps, logic blocks, processing and other symbolic representations of operations on data bits within a memory in a computing system or a computing device. These descriptions and representations are the means used by those skilled in the data processing arts to most effectively convey the substance of their work to others skilled in the art. In this detailed description, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

Unless specifically stated otherwise as apparent from the following discussions, terms such as "obtaining", "defining", "representing", "reconstructing", "calculating", "producing", "taking into account", "predicting", "inputting", "using", "modeling", "outputting", "displaying", "conserving", "performing", "updating", "repeating", "extracting", or the like, may refer to the action and processes of a computer system, or other electronic device, that transforms data represented as physical (electronic, magnetic, or optical) quantities within some electrical device's storage into other data similarly represented as physical quantities within the storage, or in transmission or display devices. These and similar terms are to be associated with the appropriate physical quantities and are merely convenient labels applied to these quantities.

Embodiments disclosed herein also relate to an apparatus for performing the operations herein. This apparatus may be specially constructed for the required purposes, or it may comprise a general-purpose computer selectively activated or reconfigured by a computer program or code stored in the computer. Such a computer program or code may be stored or encoded in a computer readable medium or implemented over some type of transmission medium. A computer-readable medium includes any medium or mechanism for storing or transmitting information in a form readable by a machine, such as a computer ('machine' and 'computer' are used synonymously herein). As a non-limiting example, a computer-readable medium may include a computer-readable storage medium (e.g., read only memory ("ROM"), random access memory ("RAM"), magnetic disk storage media, optical storage media, flash memory devices, etc.). A transmission medium may be twisted wire pairs, coaxial cable, optical fiber, or some other suitable transmission medium, for transmitting signals such as electrical, optical, acoustical or other form of propagated signals (e.g., carrier waves, infrared signals, digital signals, etc.)).

Furthermore, modules, features, attributes, methodologies, and other aspects can be implemented as software, hardware, firmware or any combination thereof. A component implemented as software can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the invention is not limited to implementation in any specific operating system or environment.

Various terms as used herein are defined below. To the extent a term used in a claim is not defined below, it should be given the broadest possible definition persons in the pertinent art have given that term as reflected in at least one printed publication or issued patent.

As used herein, "and/or" placed between a first entity and a second entity means one of (1) the first entity, (2) the second entity, and (3) the first entity and the second entity. Multiple elements listed with "and/or" should be construed in the same fashion, i.e., "one or more" of the elements so conjoined.

As used herein, "celerity" refers to the velocity of propagation of a wave through a fluid or liquid, relative to the rate of movement of the fluid or liquid through which the wave is propagated.

As used herein, "CFL condition" refers to the Courant-Friedrichs-Lewy condition, which is a condition for convergence while solving certain partial differential equations (usually hyperbolic partial differential equations) numerically. It arises when explicit time-marching schemes are used for the numerical solution. As a consequence, the timestep must be less than a certain time in many explicit time-marching computer simulations, otherwise the simulation will produce wildly incorrect results.

As used herein, "displaying" includes a direct act that causes displaying, as well as any indirect act that facilitates displaying. Indirect acts include providing software to an end user, maintaining a website through which a user is enabled to affect a display, hyperlinking to such a website, or cooperating or partnering with an entity who performs such direct or indirect acts. Thus, a first party may operate alone or in cooperation with a third party vendor to enable the reference signal to be generated on a display device. The display device may include any device suitable for displaying the reference image, such as without limitation a cathode ray tube (CRT) monitor, a liquid crystal display (LCD) monitor, a plasma device, a flat panel device, an organic light-emitting diode (OLED) device or printer. The display device may include a device which has been calibrated through the use of any conventional software intended to be used in evaluating, correcting, and/or improving display results (e.g., a color monitor that has been adjusted using monitor calibration software). Rather than (or in addition to) displaying the reference image on a display device, a method, consistent with the invention, may include providing a reference image to a subject. "Providing a reference image" may include creating or distributing the reference image to the subject by physical, telephonic, or electronic delivery, providing access over a network to the reference, or creating or distributing software to the subject configured to run on the subject's workstation or computer including the reference image. In one example, the providing of the reference image could involve enabling the subject to obtain the reference image in hard copy form via a printer. For example, information, software, and/or instructions could be transmitted (e.g., electronically or physically via a data storage device or hard copy) and/or otherwise made available (e.g., via a network) in order to facilitate the subject using a printer to print a hard copy form of reference image. In such an example, the printer may be a printer which has been calibrated through the use of any conventional software intended to be used in evaluating, correcting, and/or improving printing results (e.g., a color printer that has been adjusted using color correction software).

As used herein, the "Exner equation" is a statement of conservation of mass that applies to sediment in a fluvial system such as a river or subsurface hydrocarbon flow. Specifically, it states that bed elevation increases in proportion to the amount of sediment that drops out of transport, and decreases in proportion to the amount of sediment that becomes entrained by the flow.

As used herein, "extracting hydrocarbons" refers to activities such as determining the general geologic structure of a subsurface region, locating potential hydrocarbon reservoirs, guiding the production of a previously discovered hydrocarbon reservoir, planning the location and timing of new wells, managing production from existing wells, predicting production lifetimes of wells or hydrocarbon reservoirs at various extraction rates, and/or other activities central or peripheral to removing hydrocarbons from a hydrocarbon reservoir.

As used herein, "hydrocarbon" includes oil (often referred to as petroleum), natural gas, gas condensate, tar, and bitumen.

As used herein, "hydrocarbon reservoirs" include reservoirs containing any hydrocarbon.

As used herein, "machine-readable medium" refers to a medium that participates in directly or indirectly providing signals, instructions and/or data. A machine-readable medium may take forms, including, but not limited to, non-volatile media (e.g., ROM, disk) and volatile media (RAM). Common forms of a machine-readable medium include, but are not limited to, a floppy disk, a flexible disk, a hard disk, a magnetic tape, other magnetic media a CD-ROM, other optical media, punch cards, paper tape, other physical media with patterns of holes, a RAM, a ROM, an EPROM, a FLASH-EPROM, or other types of memory chips or cards, a memory stick, and other media from which a computer, a processor or other electronic device can read.

As used herein, "MUSCL" refers to Monotone Upstream-centered Schemes for Conservation Laws, which are finite volume methods s that can provide highly accurate numerical solutions for a given system, even in cases where the solutions exhibit shocks, discontinuities, or large gradients.

In the oil and gas industry, solving water flow and sediment transport equations is useful in constructing physics process-based models for simulations of formation and evolutions of sedimentary basins and oil and gas reservoirs, and the subsequent building of the geologic models. Such models may be useful in predicting fluid flow parameters such as erosion or deposition, and in other activities related to hydrocarbon extraction. In geologic modeling, a digital representation of the detailed internal geometry and rock properties of a subsurface earth volume, such as a petroleum reservoir or a sediment-filled basin is built. In the oil and gas industry, geologic models provide geologic input to reservoir performance simulations which are used to select locations for new wells, estimate hydrocarbon reserves, plan reservoir-development strategies, and/or perform other hydrocarbon extraction activities. The spatial distribution of permeability may assist in characterizing reservoir performance, and, together with other rock and fluid properties, may determines the producibility of the reservoir. For sandstone reservoirs, the spatial distribution of permeability is a function of the grain-size distribution of sands which compose the reservoir, the compartmentalization of those sands by barriers of finer grained material, and the mineralogy and burial history of the reservoir.

Most geologic models built for petroleum applications are in the form of a three-dimensional array of model blocks (cells), to which geologic and/or geophysical properties such as lithography, porosity, acoustic impedance, permeability, and water saturation are assigned (such properties are referred to collectively herein as "rock properties"). The entire set of model blocks represents the subsurface earth volume of interest. The goal of the geologic-modeling process is to assign rock properties to each model block in the geologic model.

In one aspect, a bed topography reconstruction scheme and a flux integration scheme balances flux gradients and corresponding bed slope source terms to second orders of accuracy over arbitrary bed topographies. The combination of the bed topography reconstruction scheme and the flux integration scheme leads to more accurate results when compared to known methods, with only a minor increase in computational effort. The method may be used with cell-centered discretization schemes where both flow variables as well as bed topographic information are represented in the center of cells.

Relative to most of the known discretization schemes in which the bed topography is represented in cell vertices, a cell-centered discretization scheme in one aspect may be the simplest one that attempts to ensure the conservation of mass for both solids below the top bed surface and the liquid above. Such a constraint may provide improved results when the flow and transport equations are coupled with sediment erosion, deposition and the sediment mass conservation equations on the bed, such as the Exner equation, to solve bed evolutions in both shallow and deep water environments. In a cell-centered discretization scheme, the amount of erosion, deposition and cell elevation change are all calculated using the flow and sediment information associated with the center of the cell, without any need of extrapolation among neighboring cells.

For known discretization schemes in which bed topography is represented in cell vertices, some extrapolation and averaging of either flow variables, or sediment erosion or deposition rate are typically useful in the calculation of elevation changes on cell vertices, which could cause numerical diffusion for the bed topography. Therefore, a cell-centered discretization scheme in accordance with the present techniques provides an advantage over known schemes that employ data along cell vertices, in that the numerical diffusion of cell elevations due to the averaging and extrapolation among neighboring cells is reduced or eliminated when the equations related to sediment transport, erosion and deposition processes are added to flow equations.

FIG. 1 is a diagram of a bed topography, a fluid surface elevation and an unstructured grid that is useful in explaining the operation of an embodiment. The diagram, which is generally referred to by reference number 100, includes a bed topography 102, a fluid surface elevation 104 and an unstructured grid 106. The unstructured grid 106 includes a plurality of two-dimensional cells. A first cell 108 is a polygon that is bounded by line segments ABCDE. A second cell 110 is a polygon that is bounded by line segments AGHB. A third cell 112 is a polygon that is bounded by line segments BHIJC. A fourth cell 114 comprises a polygon that is bounded by line segments CKLD. A fifth cell 116 is a polygon that is bounded by line segments DMNOE. A sixth 118 is a polygon that is bounded by line segments AEF.

An embodiment relates to a cell-based discretization scheme in which values of variables are associated with cell centers rather than at their vertices. Spatial variability of each variable within each cell is not stored and may only be reconstructed using different reconstruction schemes. The simplest of such schemes is the piecewise constant reconstruction scheme. In this scheme, the value for each variable remains constant within each cell and equals the value that is stored in the cell. In FIG. 1, the results of the piecewise constant reconstruction of the bed topography 102 and the fluid surface elevation 104 are shown together with the unstructured grid 106. One prominent feature to note is the discontinuities of the reconstructed values across cell edges. For example, the elevations across the cell edge BC on the underlying grid 106, which correspond to the edges marked B1C1 and B3C3 in the bed topography 102, for the first cell 108 and the third cell 112 respectively, are discontinuous. Moreover, the edges B1C1 and B3C3 are located at different positions in the z-direction relative to the underlying grid 106. Similarly, the fluid surface elevation 104 shows that the corresponding areas labeled as lines B1*C1* and B3*C3* are also discontinuous in the z-direction.

An embodiment produces continuous bed surfaces, eliminates the discontinuities as described above, and in the process, conserves the mass in volumes bounded by corresponding areas of the bed topography 102 and the fluid surface elevation 104, as well as volumes bounded by corresponding areas of the bed topography 102 and the unstructured grid 106. In other words, for each cell, the amount of mass that is enclosed between any arbitrary surface below or above the bed topography 102 remains the same before and after the reconstruction of the bed surface in that cell.

Figure 2:
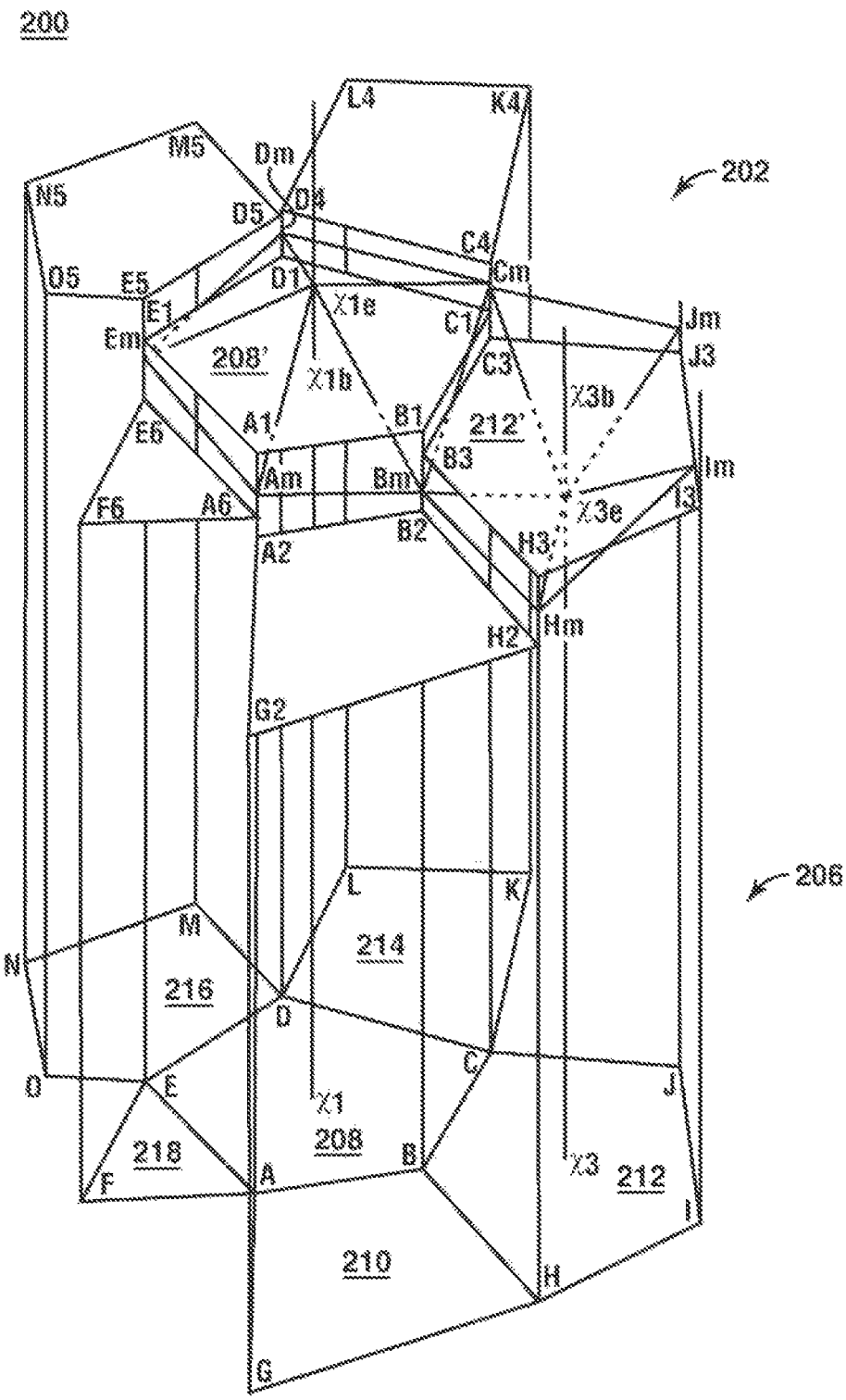
FIG. 2 is a diagram of reconstructed cells in a bed topography.

FIG. 2 is a diagram of reconstructed cells in a bed topography. The diagram, which is generally referred to by reference number 200, includes a bed topography 202 and an unstructured grid 206. The unstructured grid 206 is a plurality of cells. A first cell 208 is a polygon that is bounded by line segments ABCDE. A second cell 210 is a polygon that is bounded by line segments AGHB. A third cell 212 is a polygon that is bounded by line segments BHIJC. A fourth cell 214 is a polygon that is bounded by line segments CKLD. A fifth cell 216 is a polygon that is bounded by line segments DMNOE. A sixth cell 218 is a polygon that is bounded by line segments AEF.

The bed topography 202 includes two cells that have been reconstructed. In particular, the bed topography 202 shows a reconstructed first cell 208', which corresponds to the first cell 208 of the unstructured grid 206, and a reconstructed third cell 212', which corresponds to the third cell 212 of the unstructured grid 206.

The surfaces defined by triangles $\chi_{1e}$AmBm, $\chi_{1e}$BmCm, $\chi_{1e}$CmDm, $\chi_{1e}$DmEm, and $\chi_{1e}$EmAm are the reconstructed surfaces for the first reconstructed cell 208'. The surfaces defined by triangles $\chi_{3e}$CmBm, $\chi_{3e}$BmHm, $\chi_{3e}$HmIm, $\chi_{3e}$ImJm and $\chi_{3e}$JmCm are the reconstructed surfaces for the third reconstructed cell 212'. In FIG. 2, the points Am, Bm, Cm, Dm, Em, Hm, Im, and Jm represent the effective elevations at the vertices A, B, C, D, E, H, I, and J respectively. The points $\chi_{1e}$ and $\chi_{3e}$ are the effective cell center elevations for the first reconstructed cell 208' and the third reconstructed cell 212' respectively.

The points $\chi_{1b}$ and $\chi_1$ represent the projections of the point $\chi_{1e}$ on the original piecewise constant cell bed surface A1B1C1D1E1 and the gridding surface ABCDEF. The points $\chi_{3b}$ and $\chi_3$ are the projections of the point $\chi_{3e}$ on the original piecewise constant cell bed surface C3B3H3I3J3 and the gridding surface CBHIJ.

As set forth above the volume of regions between the bed topography 202 and the unstructured grid 206 is conserved. For example, as shown in FIG. 2, the volume enclosed by the surface ABCDE and piecewise constant bed surface A1B1C1D1E1 are the same as the volume enclosed by the surface ABCDE and the reconstructed bed surface, which includes five triangles $\chi_{1e}$AmBm, $\chi_{1e}$BmCm, $\chi_{1e}$CmDm, $\chi_{1e}$DmEm, and $\chi_{1e}$EmAm. Similarly, the volume of the fluid above the bed surface in the cell is also conserved before and after the reconstruction of the bed.

Reconstruction of a bed topography includes three steps: calculating the cell center, calculating the effective elevation at each cell vertex and calculating the effective elevation for the cell center. Each of these steps is described in detail below.

The first step of reconstructing a bed topography is to calculated the cell center. For any cell, if there are n vertices with xy-coordinates $x_i$ and $y_i$ for i=1, 2, 3, . . . n, the xy-coordinate of the cell center $x_c$ and $y_c$ may be given by equations (1) and (2):

$$x_c = \frac{1}{n}\sum_{1}^{n} x_i \quad (1)$$

$$y_c = \frac{1}{n}\sum_{1}^{n} y_i \quad (2)$$

The second step of reconstructing a bed topography is to calculate the effective elevation for the cell center. Each of the vertices of a given cell is shared among a number of cells. If a vertex is shared by m cells, and each cell j, where j=1, 2, 3, . . . m, has an averaged elevation of $z_j$, the effective elevation at each of the cell vertices may be calculated using the following equation (3):

$$z_i = \frac{\sum_{j=1}^{m} \frac{z_j}{d_j}}{\sum_{j=1}^{m} \frac{1}{d_j}} \quad (3)$$

where
$d_j = \sqrt{(x_i-x_{c,j})^2+(y_i-y_{c,j})^2}$ is the distance from a vertex to the center of the jth cell that shares the vertex.

The third step of reconstructing a bed topography is to calculate the effective elevation for the cell center. As is shown in Appendix A hereto, the effective cell center elevation may be given by equation (4):

$$z_c = \frac{z \sum_j A^{(i)} - \sum_j \left(-\frac{a_1^{(i)}}{c^{(i)}} X_c^{(i)} A^{(i)} + \frac{b_1^{(i)}}{c^{(i)}} Y_c^{(i)} A^{(i)} + \frac{d_1^{(i)}}{c^{(i)}} A^{(i)}\right)}{\sum_j \left(\frac{a_2^{(i)}}{c^{(i)}} X_c^{(i)} A^{(i)} - \frac{b_2^{(i)}}{c^{(i)}} Y_c^{(i)} A^{(i)} + \frac{d_2^{(i)}}{c^{(i)}} A^{(i)}\right)} \quad (4)$$

In equation (4), $A^{(i)}$ is the area projected to the xy plane by the ith triangle $\Omega_i$ in the cell defined by any of the two consecutive vertices i, i+1 (or vertex 1 if i=n), and the cell center. An example is triangle $AmBm\chi_{1e}$. Its projected area is the area of the triangle $AB\chi_1$. In the same equation, $X_c^{(i)}$ and $Y_c^{(i)}$ are the x and y coordinates of the center of that triangle, respectively, and the values of $a_1^{(i)}$, $a_2^{(i)}$, $b_1^{(i)}$, $b_2^{(i)}$, $c^{(i)}$, $d_1^{(i)}$, $d_2^{(i)}$ may be given by equation (A6) and equations (A8-A13) in Appendix A.

Once $z_c$ is found, the elevation of any point in a cell with coordinates (x,y) on the reconstructed bed surface may be given by equation (5):

$$z = \frac{-a^{(i)}x + b^{(i)}y + d^{(i)}}{c^{(i)}} \quad (5)$$

with $(x,y) \in \Omega_i$. In above equation, $a^{(i)}$, $b^{(i)}$, $c^{(i)}$, and $d^{(i)}$ are given by equations (A4-A7), respectively, in Appendix A.

The reconstructed bed surface elevation z can be obtained in another way. For each triangle $\Omega_i$, its surface gradient $$(S_{\eta_x}^{(i)}, S_{\eta_y}^{(i)}) = \left(\frac{\partial z}{\partial x}, \frac{\partial z}{\partial y}\right)$$

may be given by equations (6) and (7):

$$S_{\eta_x}^{(i)} = -\frac{(y_i - y_c)z_{i+1} + (y_c - y_{i+1})z_i + (y_{i+1} - y_i)z_c}{x_c y_{i+1} - x_i y_{i+1} + x_{i+1} y_i - x_c y_i + x_i y_c - x_{i+1} y_c} \quad (6)$$

$$S_{\eta_y}^{(i)} = -\frac{(x_i - x_c)z_{i+1} + (x_c - x_{i+1})z_i + (x_{i+1} - x_i)z_c}{x_c y_{i+1} - x_i y_{i+1} + x_{i+1} y_i - x_c y_i + x_i y_c - x_{i+1} y_c} \quad (7)$$

Therefore, $$z = z_c + S_{\eta_x}^{(i)}(x-x_c) + S_{\eta_y}^{(i)}(y-y_c) \quad (8)$$

It can be shown that equations (5) and (8) are equivalent.

Figure 3:
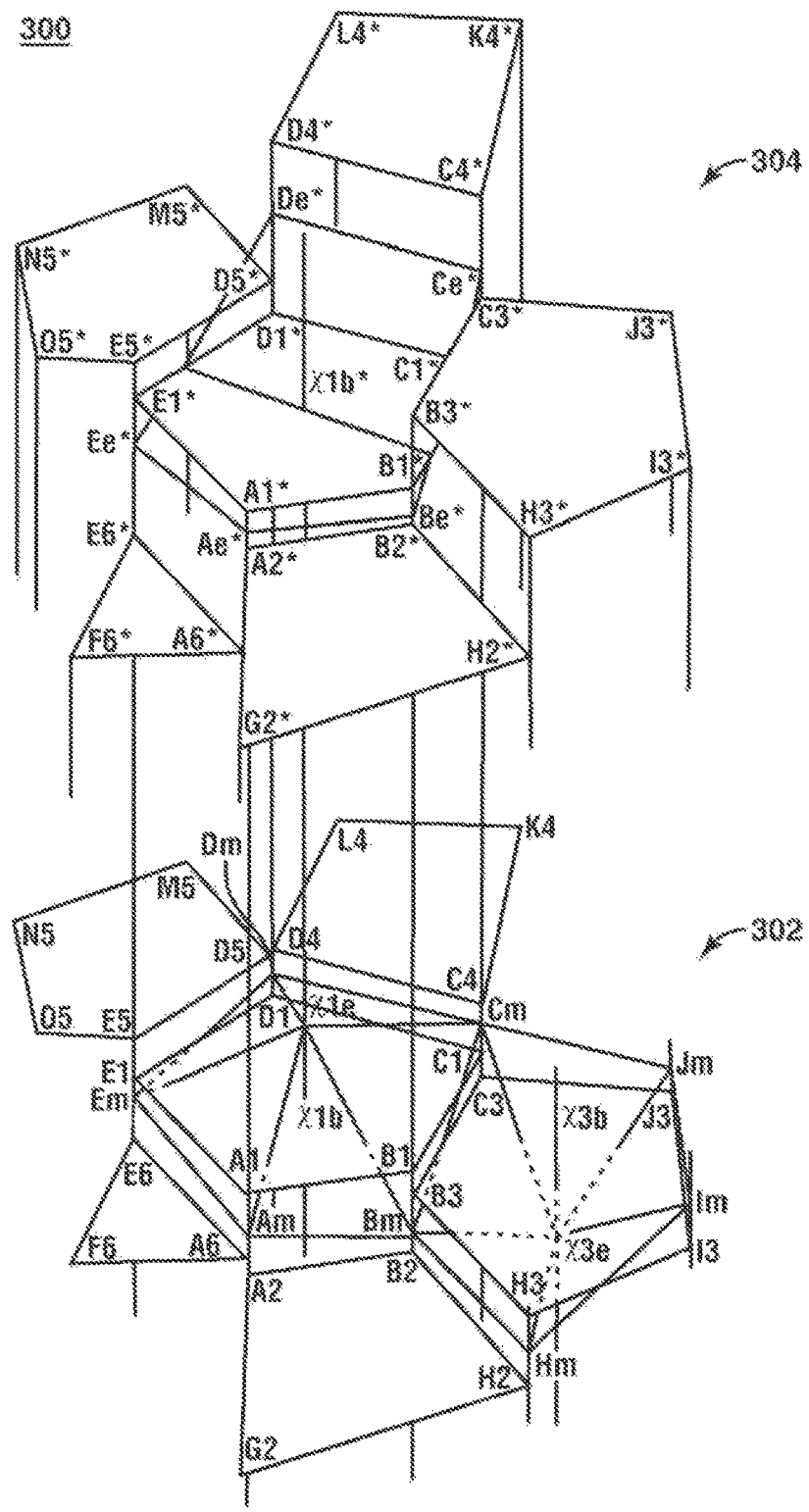
FIG. 3 is a diagram of reconstructed cells in a bed topography and a corresponding fluid surface elevation.

FIG. 3 is a diagram of reconstructed cells in a bed topography and a corresponding fluid surface elevation. The diagram, which is referred to generally by reference number 300, includes a bed topography 302 and a fluid surface elevation 304. The bed topography 302 comprises the reconstructed cells described above with reference to FIG. 2.

In the diagram 300, the surfaces A1*B1*C1*D1*E1*, A2*G2*H2*B2*, B3*H3*I3*J3*C3*, D4*C4*K4*L4*, O5*E5*D5*M5*N5*, and F6*A6*E6* of the fluid surface elevation 304 are piecewise constant representation of a fluid surface. The surface Ae*Be*Ce*De*Ee* is the piecewise linear representation of the fluid surface. The fluid surface may be represented by a number of different schemes. The two simplest schemes are the piecewise constant scheme and the piecewise linear scheme.

A piecewise constant scheme may assume that the fluid surface elevation $\xi(x,y)$ is constant everywhere in a cell. Such a piecewise linear scheme may take many different forms. For example, one form is set forth in the equations (9), (10), (11), and (12):

$$\xi(x,y) = \bar{\xi} + S_{\xi_x}(x-x_c) + S_{\xi_y}(y-y_c) \quad (9)$$

Since $$\int(x-x_c)dxdy = \int x dx dy - x_c \int dx dy = 0 \quad (10)$$

and $$\int(y-y_c)dxdy = \int y dx dy - y_c \int dx dy = 0 \quad (11)$$

it may be shown that $$\int \xi(x,y) dx dy = \bar{\xi} \int dx dy \quad (12)$$

for any values of $S_{\xi_x}$ and $S_{\xi_y}$. Accordingly, mass conservation is strictly preserved in this scheme.

Another aspect is that calculations of the inter-cell fluxes correspond to the reconstruction scheme described above. The general form of the governing equations for both shallow and deep water turbidity current can be written as equation (13):

$$\frac{\partial}{\partial t}\int_\Omega \overline{U} dx dy + \oint_{\partial\Omega}(\overline{F} dy - \overline{G} dx) = \int_\Omega \overline{S}_g dx dy + \int_\Omega \overline{S}_f dx dy \quad (13)$$

where $\overline{U}$ is the vector of conservative variables, $\overline{F}$ and $\overline{G}$ are the vectors that are related to the conservative form of the fluxes in x and y directions respectively, $\overline{S}_g$ is the vector of the source terms related to the gravitational forces, and $\overline{S}_f$ is the vector of the source terms originated from other than gravitational forces. Only the first three terms may need to be calculated using inventive methods disclosed herein. The calculation for the last term may use existing methods and can be readily determined.

The specific form of $\overline{U}$, $\overline{F}$, $\overline{G}$ and $\overline{S}_g$ may vary from different formulations for shallow and deep water flows. One embodiment may, however, be applied with respect to all of the forms.

Apart from the source term $\overline{S}_f$, the general form for the governing equations for both shallow water flows and the turbidity currents in deep water environment can be written in a unified fashion as shown below in equations (14), (15), (16) and (17), where $$\overline{U} = \begin{pmatrix} u_x h \\ u_y h \\ h \\ hC_k \\ \vdots \\ hK \end{pmatrix} \quad (14)$$

$$\bar{F} = \begin{pmatrix} u_x^2 h + \frac{1}{2}(R_w + RC)gh^2 \\ u_x u_x h \\ hu_x \\ hu_x C_b \\ \vdots \\ hu_x K \end{pmatrix} \quad (15)$$

$$\bar{G} = \begin{pmatrix} u_x u_x h \\ u_y^2 h + \frac{1}{2}(R_w + RC)gh^2 \\ hu_y \\ hu_y C_b \\ \vdots \\ hu_y K \end{pmatrix} \quad (16)$$

$$\bar{S}_g = \begin{pmatrix} -(R_w + RC)gh\frac{\partial z}{\partial x} \\ -(R_w + RC)gh\frac{\partial z}{\partial y} \\ 0 \\ 0 \\ \vdots \\ 0 \end{pmatrix} \quad (17)$$

In the above equations, $u_x$ and $u_y$ are the x- and y-components of the depth averaged flow velocity respectively, h is the depth of the turbid flow, z is the bottom elevation, $C_k$ is the volumetric concentration of the sediments in the kth grain size bin and equation (18)

$$C = \sum_{k=1}^{n} C_k \quad (18)$$

represents the total sediment concentration. In equations (15) and (16), g represents the gravitational constant, and R is the submerged specific weight for the sediments. R may be represented by $$R = \frac{\rho_x - \rho_w}{\rho_w} \quad (19)$$

In equation (19), $\rho_x$ and $\rho_w$ are the sediment and water density respectively. In equations (14)-(16), K is the turbulent kinetic energy. The definition of $R_w$ in equations (15) and (16) may be given by $$R_w = \frac{\rho_w - \rho_a}{\rho_w} \quad (20)$$

where $\rho_a$ is the density of the ambient fluid. In a deep water environment, the ambient fluid is the same as the flowing fluid, therefore $R_w$ can be represented by $$R_w = \frac{\rho_w - \rho_a}{\rho_w} = \frac{\rho_w - \rho_w}{\rho_w} = 0 \quad (21)$$

On the other hand, in a shallow water environment, the ambient fluid is air, which has a density much smaller than the water density, where $\rho_a \ll \rho_w$. Therefore $R_w$ can be represented by $$R_w = \frac{\rho_w - \rho_a}{\rho_w} = 1 - \frac{\rho_a}{\rho_w} \approx 1 \quad (22)$$

for the shallow water environment.

Without the loss of generality, the flow properties $u_x$, $u_y$, $C_k$, for k=1, 2, . . . n, and K are all treated as piecewise constant in the cell in the descriptions of the method given below. However, the method described below can be easily applied without treating the flow properties $u_x$, $u_y$, $C_k$, for k=1, 2, . . . n, and K as piecewise constant in the cell. In those situations, any well-known extrapolation schemes for $u_x$, $u_y$, $C_k$, for k=1, 2, . . . n, and K can be used with the disclosed aspects.

In one aspect, fluxes may be calculated across cell faces. An example of a cell face is the surface BmCmCe*Be* shown in FIG. 3. The calculation of flux across a cell face is described in detail below with reference to FIG. 4.

Figure 4:
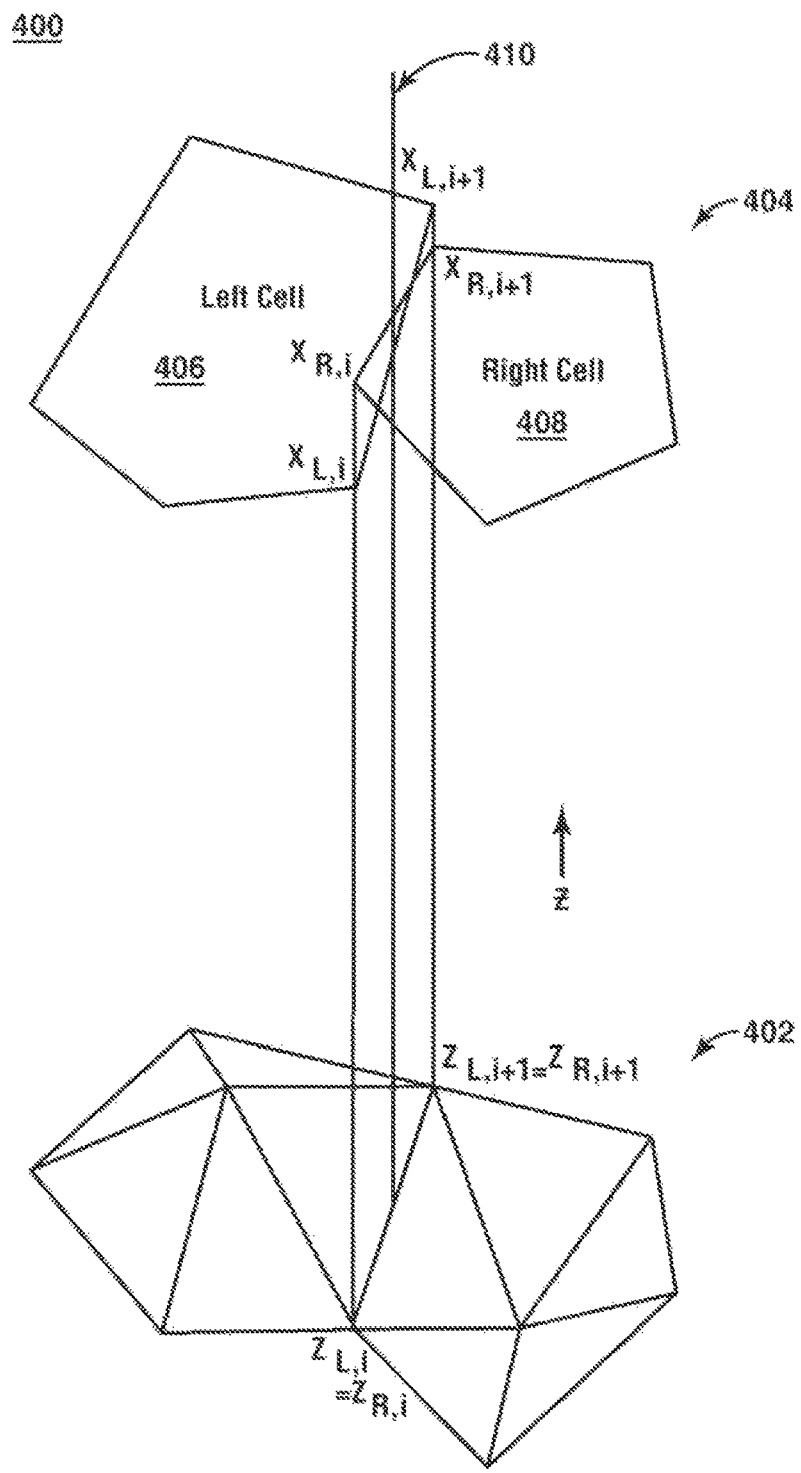
FIG. 4 is a diagram that is useful in explaining calculation of flux between a left cell and a right cell.

FIG. 4 is a diagram that is useful in explaining calculation of flux between a left cell and a right cell. The diagram is referred to generally by reference number 400. The diagram 400 comprises bed topography 402 and a fluid surface elevation 404. The bed topography 402 represents a subset of the bed topography 302 shown in FIG. 3. In particular, the representation of the bed topography 402 corresponds to the reconstructed cells of the bed topography 302. The fluid surface elevation 404 represents a subset of the fluid surface elevation 304 shown in FIG. 3. Without losing generality, a first cell 406 of the fluid surface elevation is denoted as a left cell. A second cell 408 of the fluid surface elevation 404 is denoted as a right side cell. Calculating the fluxes of fluid flowing between the left cell and the right cell is described in detail below.

The reconstructed bed surfaces of the topography bed 402, which may be obtained using a reconstruction scheme disclosed herein, are continuous across the cell faces. The fluid surfaces of the fluid surface elevation 404 are, however, often discontinuous as shown in FIG. 4. Therefore the water depths at the cell face in two cells are often different from each other. Also, the degree of the discontinuities may be different at the different locations on the cell face. The expression $h_L = h_L(l)$ may be used to denote the water depth at the cell face in the left cell, and at the location l distance away from the center line 410 of cell face as shown in FIG. 4. Similarly, $h_R = h_R(l)$ denotes the corresponding water depth in the right cell. It can be shown that $$h_L(l) = h_L^{(0)} + \Delta_L \frac{l}{l_0} = h_L^{(0)}\left(1 + \frac{\Delta_L}{h_L^{(0)}}\frac{l}{l_0}\right) = h_L^{(0)}(1 + \tilde{\Delta}_L \tilde{l}) \quad (23)$$

$$h_R(l) = h_R^{(0)} + \Delta_R \frac{l}{l_0} = h_g^{(0)}\left(1 + \frac{\Delta_R}{h_R^{(0)}}\frac{l}{l_0}\right) = h_R^{(0)}(1 + \tilde{\Delta}_R \tilde{l}) \quad (24)$$

where $$h_L^{(0)} = \frac{1}{2}(\xi_{L,i} - z_{L,i} + \xi_{L,i+1} - z_{L,i+1}) \quad (25)$$

$$h_R^{(0)} = \frac{1}{2}(\xi_{R,2} - z_{R,i} + \xi_{R,i+1} - z_{R,i+1}) \quad (26)$$

-continued $$\Delta_L = \frac{(\xi_{L,i+1} - z_{L,i+1}) - (\xi_{L,i} - z_{L,i})}{2} \quad (27)$$

$$\Delta_R = \frac{(\xi_{R,i+1} - z_{R,i+1}) - (\xi_{R,i} - z_{R,i})}{2} \quad (28)$$

In the above equations, $l_0$ is the half cell edge length for cell i or i+1, $$\hat{l} = \frac{l}{l_0} \quad (29)$$

is the dimensionless distance from the cell face middle line, $$\hat{\Delta}_L = \frac{\Delta_L}{h_L^{(0)}} \quad (30)$$

is the dimensionless maximum fluid depth change in the left cell at the cell face, and $$\hat{\Delta}_R = \frac{\Delta_R}{h_R^{(0)}} \quad (31)$$

is the dimensionless maximum fluid depth change in the right cell at the cell face.

The fluxes across the cell face can be evaluated using many different solvers. Here a solver known as HLL solver ('HLL' being an acronym for Harten, Lax, and van Leer) is used as an example. The HLL solver obtains an approximate solution for the inter-cell numerical flux directly by assuming a particular wave configuration for the solution and calculating the wave speed (Harten, A., Lax, P., and van Leer, A., "On upstream differencing and Godunov-type scheme for hyperbolic conservation laws", Soc. Indus. Appl. Math. Rev., 25(1), 35-61, 1987.). The HLL solver has proven stable even when running long enough to generate highly complicated stratigraphy.

Assuming $$\overline{FG}_L = (\overline{F}_L, \overline{G}_L), \quad (32)$$

the flux across the cell face may be given by equation $$\overline{F}^* \cdot \overline{n} = \frac{s_R \overline{FG}_L \cdot \overline{n} - s_L \overline{FG}_R \cdot \overline{n} + s_L s_R (\overline{U}_R - \overline{U}_L)}{s_R - s_L} \quad (33)$$

where the celerities of the waves at the cell face are $s_L$ and $s_R$, $\overline{F}^*(l)$ represents the flux per unit width between two cells at the location that is a distance l from a cell face middle line between the at least two of the cells, and $\overline{n}$ represents the unit vector that is perpendicular to $\overline{F}^*$ with its variable l shown.

Other variables helpful in understanding disclosed aspects include the following: $l_0$, representing half of the length of the boundary between the at least two of the cells; $\overline{f}^{*(0)}$, representing a first expansion coefficient corresponding to a zeroth order flux per unit width at the center of the edge between the at least two of the cells, the first expansion coefficient being computed according to equation (B48) in Appendix B; $\overline{f}_3^*$, representing a second expansion coefficient that is computed according to equation B51 in Appendix B; $\hat{\Delta}_L^2$, representing the square of a dimensionless maximum fluid depth change in a first of the at least two of the cells; $\overline{f}_4^*$, representing a third expansion coefficient that is computed according to equation (B52) in Appendix B; $\hat{\Delta}_R^2$, representing the square of a dimensionless maximum fluid depth change in a second of the at least two of the cells; $\overline{f}_5^*$, representing a fourth expansion coefficient that is computed according to equation (B53) in Appendix B; $\hat{\Delta}_L$, representing a dimensionless maximum fluid depth change in the first of the at least two of the cells; and $\hat{\Delta}_R$, representing a dimensionless maximum fluid depth change in the second of the at least two of the cells.

Separating constant states in the solution of the local Riemann problem can be calculated using Toro's two expansion approach as set forth in E. F. Toro, "Riemann Problems and the WAF Method for Solving Two-Dimensional Shallow Water Equations", Phil. Trans. Roy. Soc. London, A338: 43-68, (1992), and E. F. Toro, "The Weighted Average Flux Method Applied to the Time-Dependent Euler Equations", Phil. Trans. Roy. Soc. London, A341: 499-530 (1992). Toro's two expansion approach states that for wet cells, $$s_L = \min(\overline{q}_L \cdot \overline{n} - \sqrt{(R_w + RC)gh_L}, u^* - \sqrt{(R_w + RC)gh^*}) \quad (34)$$

$$s_R = \min(\overline{q}_R \cdot \overline{n} + \sqrt{(R_w + RC)gh_R}, u^* + \sqrt{(R_w + RC)gh^*}) \quad (35)$$

where $$\overline{q}_L = (u_{xL}, u_{yL}) \quad (36)$$

and $$\overline{q}_R = (u_{xR}, u_{yR}). \quad (37)$$

In the above equations, $u_{xL}$ and $u_{yL}$ are the x and y components of the flow velocity in the left cell, respectively. Similarly, $u_{xR}$ and $u_{yR}$ are respectively the x and y components of the flow velocity in the right cell.

In equations (34) and (35), $$u^* = \frac{1}{2}(\overline{q}_L + \overline{q}_R) \cdot \overline{n} + \sqrt{(R_w + RC)gh_L} - \sqrt{(R_w + RC)gh_R} \quad (38)$$

and $$\sqrt{(R_w + RC)gh^*} = \frac{1}{2}\left(\sqrt{R_w + RC)gh_L} + \sqrt{(R_w + RC)gh_R}\right) + \frac{1}{4}(\overline{q}_L - \overline{q}_R) \cdot \overline{n} \quad (39)$$

Because the fluid depths in both left and right cells vary with the distance l from the center of the cell face, and the differences of the fluid depths across the cell face also varies with l, the value of flux $\overline{F}^* \cdot \overline{n}$ in equation (33) varies with l. The calculation of the total flux across the cell face requires the evaluation the integral $\int_{-l_0}^{l_0} \overline{F}^*(l) \cdot \overline{n} dl$. To avoid computing the integral numerically, which may add significant amount of computational overhead to the scheme, equation (33) is first Taylor expanded to the order of $o(\hat{\Delta}_L^2)$, $o(\hat{\Delta}_R^2)$ or $o(\hat{\Delta}_L \hat{\Delta}_R)$ and then the result is integrated over $\hat{l}$ analytically. Detailed derivation is given in Appendix B. The final result is $$\int_{-l_0}^{l_0} \overline{F}^*(l) \cdot \overline{n} dl = 2l_0 \overline{f}^{*(0)} + \frac{2}{3}l_0(\overline{f}_R^* \hat{\Delta}_L^2 + \overline{f}_A^* \hat{\Delta}_R^2 + \overline{f}_5^* \hat{\Delta}_L \hat{\Delta}_R) \quad (40)$$

where the expressions for evaluating $\overline{f}^{*(0)}$, $\overline{f}_3^*$, $\overline{f}_4^*$ and $\overline{f}_5^*$ are given in equations (B48) to (B53) in Appendix B.

The current reconstruction scheme subdivides a cell into a number of triangles. Therefore the integration of the source term in equation (13) is also subdivided into the corresponding number of parts before each parts are summed together to yield the final results. The detailed steps of the calculation are shown in Appendix C. The result is $$\int_\Omega \bar{S}_R dx dy = \begin{pmatrix} \sum_l -S_{\eta c}^{(l)}(R_w + RC)[(\bar{\xi} - z_c)A_{\Omega_l} + (S_{\phi c} - \\ S_{\eta c}^{(i)})(x_c^{(i)} - x_c)A_\Omega + (S_{\phi y} - S_{\eta y}^{(i)})(y_v^{(i)} - y_c)A_{\Omega_l}] \\ \sum_l -S_{\eta y}^{(i)}(R_w + RC)[(\bar{\xi} - z_0)A_{\Omega_l} + (S_Q - \\ S_\phi^{(i)})(x_c^{(i)} - x_c)A_{\Omega_l} + (S_Q - S_\phi^{(i)})(y_c^{(i)} - y_c)A_{\Omega_l}] \\ 0 \\ 0 \\ 0 \\ 0 \end{pmatrix} \quad (41)$$

Figure 5:
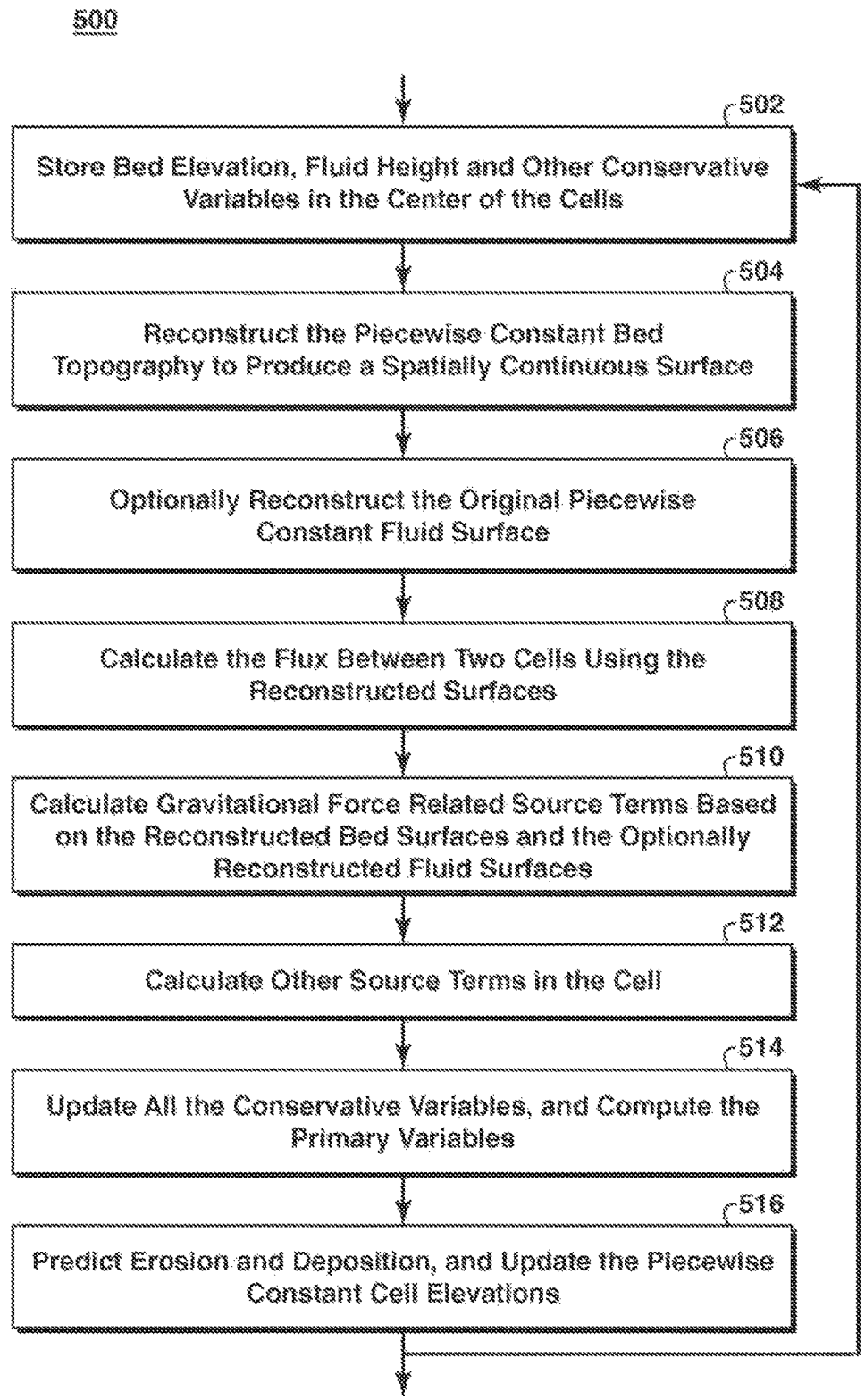
FIG. 5 is a process flow diagram showing a method according to aspects disclosed herein.

FIG. 5 is a process flow diagram showing a method 500 according to disclosed techniques and methodologies. At block 502 an initial bed topography of a subsurface region is obtained. The bed topography is defined by a plurality of cells. Each of the plurality of cells has an elevation associated with its cell center. This elevation may be a fluid height elevation, bed elevation, or both. Other conservation variables, such as sediment volumes, may be stored in the center of one or more cells. The values may be stored in a memory (as discussed further herein) associated with each cell center. As shown in the figures, a two-dimensional unstructured grid of cells, with elevations associated with the cell centers, may form and be represented as a piecewise constant bed topography (and/or a piecewise constant fluid surface topography) that may be expressed or displayed as a three-dimensional model of cells showing bed and/or fluid elevations.

Using the elevations stored at block 502, at block 504 the piecewise constant bed topography is reconstructed to produce a spatially continuous surface for flux and source term calculations. At block 506, a piecewise constant fluid topography may be reconstructed based on the spatially continuous surface. At block 508 flux between cells is calculated using the reconstructed bed topography. As an example, the flux calculation may be performed as described above with reference to FIG. 4 and may include calculating flux terms based on the reconstructed bed topography. For example, the flux calculation may take into account variations of the bed topography across a face between the cells. At block 510, gravitational force-related source constants may be calculated based on the reconstructed bed topography. The reconstructed fluid topography may additionally be used in calculating the gravitational force-related source constants. At block 512, other source terms for the cells may be calculated, if needed.

The conservative variables stored at block 502 may be updated and primary variables computed, as shown at block 514. Based on the updated variables, fluid flow parameters such as erosion and deposition may be predicted, as shown at block 516. The piecewise constant cell elevations may additionally be updated. As shown in FIG. 5, the method may return repeatedly to block 502 to improve accuracy of fluid flow predictions.

Figure 6:
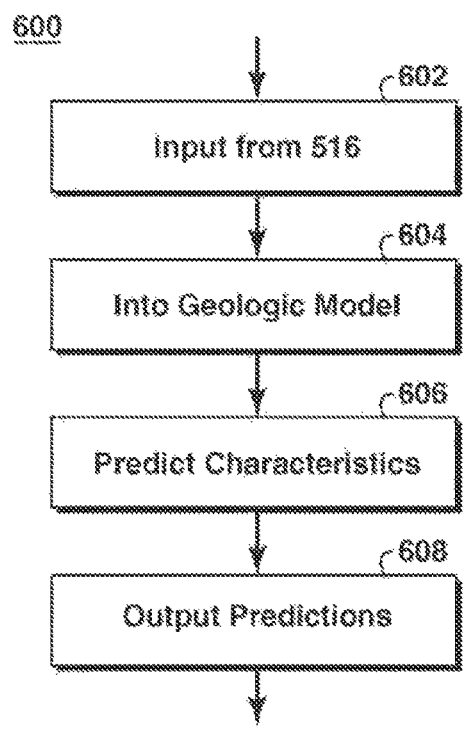
FIG. 6 is a process flow diagram showing a method according to aspects disclosed herein.

FIG. 6 shows a method 600 that uses predictions of fluid flow, erosion and/or deposition as an input to a geologic model. At block 602 the method receives such predictions as are made at block 516 of FIG. 5. At block 604 the predictions are input into a geologic model. The geologic model may be one as is described previously herein. At block 606 the geologic model is used to predict geologic characteristics (such as sediment grain size distribution, porosity, permeability, connectivity, and the like) of a subsurface region. At block 608 values for the predicted characteristics are outputted.

Figure 7:
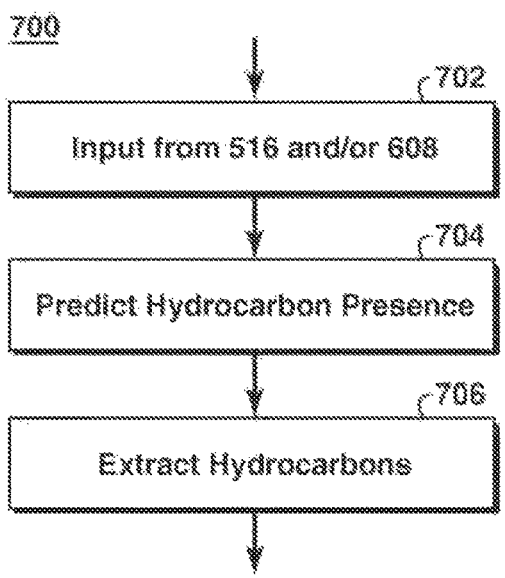
FIG. 7 is a process flow diagram showing a method according to aspects disclosed herein.

FIG. 7 shows a method 700 that uses predictions of fluid flow, erosion and/or deposition, and/or geologic characteristics to extract hydrocarbons from a subsurface region, which may include a hydrocarbon reservoir or field. At block 702 the method receives the predictions made at block 516 and/or block 608. At block 704 the presence of hydrocarbons in a subsurface region is predicted based at least in part on the predictions made at block 516. At block 706 hydrocarbons are extracted from the subsurface region. The activities defined by the term "extracting hydrocarbons" may be broadly interpreted as set forth herein.

Figure 8:
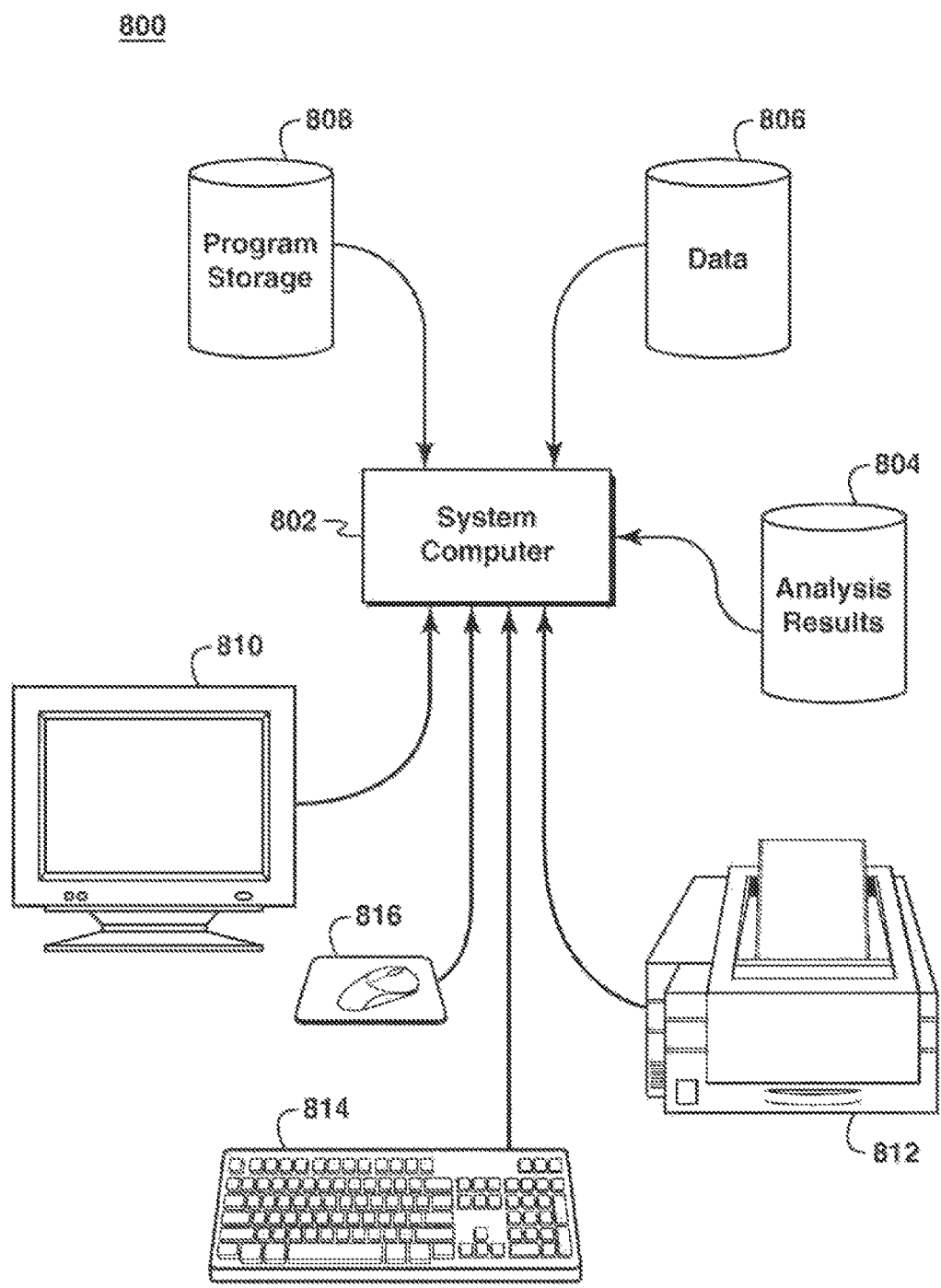
FIG. 8 is a simplified block diagram of a computer environment.

FIG. 8 depicts a block diagram of a computing environment 800 that may implement one or more of the disclosed methods. Computing environment 800 includes a system computer 802, which may be implemented as any conventional personal computer or workstation, such as a UNIX-based workstation or any other computing clusters or supercomputers. The system computer 802 is in communication with disk storage devices 804, 806, and 808, each of which may be any known type of computer-readable storage media such as external hard disk storage devices that are either directly connected to the system computer or accessed using a local area network or by remote access. Although disk storage devices 804, 806, and 808 are illustrated as separated devices, a single disk storage device may be used to store any and all of the program instructions, measurement data, and results as desired.

In one aspect, the input data are stored in disk storage device 806. The system computer 802 may retrieve the appropriate data from the disk storage device 806 to perform program instructions corresponding to the methods described herein. The program instructions may be written in a computer programming language, such as C++, C#, Java and the like. The program instructions may be stored in a computer-readable memory, such as program disk storage device 808. System computer 802 presents output primarily onto a text/graphics display 810, or alternatively to a printer 812. The system computer 802 may store the predictions or other results of the methods described herein on disk storage 804, for later use and further analysis. A keyboard 814 and a pointing device (e.g., a mouse, trackball, or the like) 816 may be provided with the system computer 802 to enable interactive operation. The system computer 802 may be located at a data center remote from the reservoir. Additionally, while the description above is in the context of computer-executable instructions that may run on one or more computers, those skilled in the art will recognize that the subject matter as claimed also can be implemented in combination with other program modules and/or as a combination of hardware and software.

Figure 9:
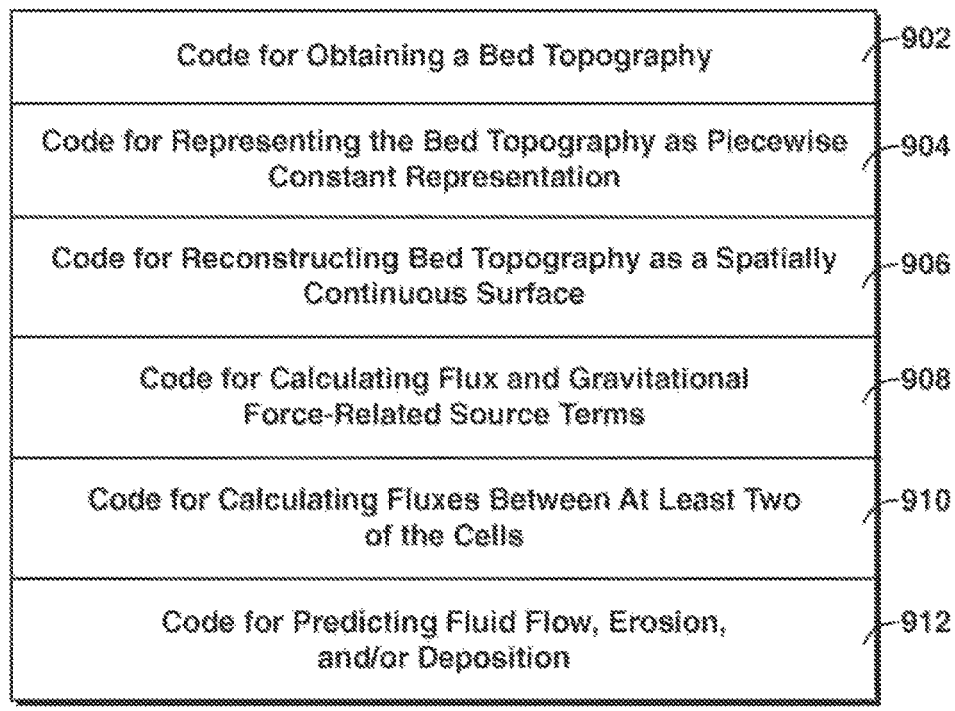
FIG. 9 is a block diagram showing a tangible, machine-readable medium that stores code to perform methods according to aspects disclosed herein.

FIG. 9 is a block diagram showing a tangible, machine-readable medium that stores code adapted to perform method disclosed herein. The tangible, machine-readable medium is generally referred to by the reference number 900. The tangible, machine-readable medium 900 may comprise one or more hard disk drives, a DVD, a CD or the like, and may correspond to disk storage device 806 in FIG. 8. The tangible, machine-readable medium 900 stores computer-readable code 902 for obtaining a bed topography of a subsurface region, where the bed topography is defined by a plurality of cells. Each of the plurality of cells has an elevation associated with its cell center, and the bed topography and elevations may be stored in a memory location in disk storage devices 804, 806, and/or 808. Code 904 represents the bed topography as a cell-centered piecewise constant representation based on the cell center elevations. Code 906 reconstructs the bed topography as a spatially continuous surface. Code 908 calculates flux and gravitational force-related source terms based on the reconstructed bed topography. The tangible, machine-readable medium 900 also stores code 910, which calculates fluxes between at least two of the cells taking into account variations of the bed topography across a face between the at least two of the cells. Code 912 predicts fluid flow, deposition of sediments onto the bed, and/or erosion of sediments from the bed using the fluxes and the gravitational force-related source terms. Furthermore, the tangible, machine-readable medium 900 may contain or store code relating to one or more of: inputting predictions into a geologic model of the subsurface region, using the geologic model to predict characteristics of the subsurface region, outputting the predicted characteristics of the subsurface region, predicting the presence of hydrocarbons in the subsurface region, extracting hydrocarbons from the subsurface region, and any other actions or steps disclosed herein.

The invention may have broad applications in the oil and gas industry, as well as many other areas such as environmental protection and management, flood and hurricane control, and flood and hurricane forecasting.

The disclosed embodiments and methodologies may be susceptible to various modifications and alternative forms and have been shown only by way of example. For example, the formulas and expressions disclosed herein, and the variables contained in those formulas and expressions, may be modified or expressed in alternative forms. The disclosed embodiments and methodologies are not intended to be limited to the particular embodiments disclosed herein, but include all alternatives, modifications, and equivalents falling within the spirit and scope of the appended claims.

APPENDIX A

Cell center effective elevation calculation.

Consider a cell with n vertices arranged counter clockwise from i=1, 2, 3, . . . to n. Each vertex i has a coordinate of $(x_i, y_i)$. The coordinate of the center of the cell $(x_c, y_c)$ is then given by equation (1) and (2). The triangle defined by any two consecutive vertices i, i+1 (or vertex 1 if i=n), and the cell center is referred to as $\Omega_i$.

Denote the effective elevation of each vertex i and $z_i$ and of the cell center as $z_c$. Use $\bar{z}$ to denote the piecewise constant representation of the cell elevation. The problem is to find the value for $z_c$, such that the cell averaged elevation over the surfaces defined by $\Omega_i$ for i=1, 2, 3, . . . n equals $\bar{z}$. In other words, solve $z_c$ so that $$\sum_i \int_{\Omega_i} z dx dy = \bar{z} \sum_j A_i, \tag{A1}$$

where z=z(x,y) is the reconstructed cell elevation at location (x,y).

In triangle $\Omega_i$, z should satisfy the following equation $$\begin{vmatrix} x & y & z & 1 \\ x_c & y_c & z_c & 1 \\ x_i & y_i & z_i & 1 \\ x_{i+1} & y_{i+1} & z_{i+1} & 1 \end{vmatrix} = 0 \tag{A2}$$

In equation (A2) and throughout Appendix A, we define i+1=1, if i=n.

From above equation, it may be shown that $$z = \frac{-a(i)x + b^{(i)}y + d^{(i)}}{c^{(i)}} \tag{A3}$$

where $$a^{(i)} = a_1^{(i)} + a_2^{(i)} z_c \tag{A4}$$

$$b^{(i)} = b_1^{(i)} + b_2^{(i)} z_c \tag{A5}$$

$$c^{(i)} = x_c y_i - x_c y_{i+1} - x_i y_c + x_i y_{i+1} + x_{i+1} y_c - x_{i+1} y_i \tag{A6}$$

$$d^{(i)} = d_1^{(i)} + d_2^{(i)} z_c \tag{A7}$$

and $$a_1^{(i)} = y_c z_i - y_c z_{i+1} + y_i z_{i+1} - y_{i+1} z_i \tag{A8}$$

$$a_2^{(i)} = y_i - y_{i+1} \tag{A9}$$

$$b_1^{(i)} = x_c z_i - x_c z_{i+1} + x_i z_{i+1} - x_{i+1} z_i \tag{A10}$$

$$b_2^{(i)} = x_i - x_{i+1} \tag{A11}$$

$$d_1^{(i)} = x_c(y_i z_{i+1} - y_{i+1} z_i) - y_c(x_i z_{i+1} - x_{i+1} z_i) \tag{A12}$$

$$d_2^{(i)} = x_i y_{i+1} - x_{i+1} y_i \tag{A13}$$

Substitute equation (A3) for equation (A1), using the following properties where $$\int_{\Omega_i} x dx dy = X_c^i A_i \tag{A14}$$

and $$\int_{\Omega_i} y dx dy = Y_c^i A_i \tag{A15}$$

the effective cell center elevation is given by $$z_c = \frac{\bar{z} \sum_i A^{(i)} - \sum_i \left( -\frac{a_1^{(i)}}{c^{(i)}} X_c^{(i)} A^{(i)} + \frac{b_1^{(i)}}{c^{(i)}} Y_c^{(i)} A^{(i)} + \frac{d_1^{(i)}}{c^{(i)}} A^{(i)} \right)}{\sum_i \left( \frac{a_1^{(i)}}{c^{(i)}} X_c^{(i)} A^{(i)} - \frac{b_1^{(i)}}{c^{(i)}} Y_c^{(i)} A^{(i)} + \frac{d_1^{(i)}}{c^{(i)}} A^{(i)} \right)} \tag{A16}$$

APPENDIX B

Calculation of HLL fluxes.

To enable an analytical integration of the equation (33) with regard to the variable $\hat{l}$, the HLL flux function shown in the right side of equation (33) is first Taylor expanded to the second order of $o(\hat{\Delta}_L^2)$, $o(\hat{\Delta}_R^2)$ or $o(\hat{\Delta}_L \hat{\Delta}_R)$.

Substituting equations (23) and (24) into equations (14) to (17) and expanding the results to the second order, we obtain $$\overline{FG}_L = \overline{FG}_L^0 + \bar{f}_1 \hat{\Delta}_L \hat{l} + \bar{f}_2 \hat{\Delta}_L^2 \hat{l}^2 \tag{B1}$$

$$\overline{FG}_R = \overline{FG}_R^0 + \bar{f}_3 \hat{\Delta}_R \hat{l} + \bar{f}_4 \hat{\Delta}_R^2 \hat{l}^2 \tag{B2}$$

$$\overline{U}_L = \overline{U}_L^0 + \bar{g}_1 \hat{\Delta}_L \hat{l} \tag{B3}$$

$$\overline{U}_R = \overline{U}_R^0 + \bar{g}_2 \hat{\Delta}_R \hat{l} \tag{B4}$$

where $$\overline{FG}_L^{(0)} = \left(\overline{F}_L^{(0)}, \overline{G}_L^{(0)}\right) \tag{B5}$$

$$= \begin{pmatrix} u_{x,L}^2 h_L^{(0)} + \frac{1}{2}(R_w + RC_L)g h_L^{(0)2} & u_{x,L} u_{y,L} h_L^{(0)} \\ u_{x,L} u_{y,L} h_L^{(0)} & u_{y,L}^2 h_L^{(0)} + \frac{1}{2}\left(\frac{R_w+}{RC_L}\right)g h_L^{(0)2} \\ h_L^{(0)} u_{x,L} & h_L^{(0)} u_{y,L} \\ h_L^{(0)} u_{x,L} C_{k,L} & h_L^{(0)} u_{y,L} C_{k,L} \\ \vdots & \vdots \\ h_L^{(0)} u_{x,L} K_L & h_L^{(0)} u_{y,L} K_L \end{pmatrix}$$

$$\bar{f}_1 = \begin{pmatrix} u_{x,L}^2 h_L^{(0)} + (R_w + RC_L)g h_L^{(0)2} & u_{x,L} u_{y,L} h_L^{(0)} \\ u_{x,L} u_{y,L} h_L^{(0)} & u_{y,L}^2 h_L^{(0)} + (R_w + RC_L)g h_L^{(0)2} \\ u_{x,L} h_L^{(0)} & u_{y,L} h_L^{(0)} \\ u_{x,L} K_L h_L^{(0)} & u_{y,L} K_L h_L^{(0)} \\ \vdots & \vdots \\ u_{x,L} K_L h_L^{(0)} & u_{y,L} K_L h_L^{(0)} \end{pmatrix} \tag{B6}$$

$$\bar{f}_2 = \begin{pmatrix} \frac{1}{2}(R_w + RC_L)g h_L^{(0)2} & 0 \\ 0 & \frac{1}{2}(R_w + RC_L)g h_L^{(0)2} \\ 0 & 0 \\ 0 & 0 \\ \vdots & \vdots \\ 0 & 0 \end{pmatrix} \tag{B7}$$

$$\overline{FG}_R^{(0)} = \left(\overline{F}_R^{(0)}, \overline{G}_R^{(0)}\right) \tag{B8}$$

$$= \begin{pmatrix} u_{x,L}^2 h_L^{(0)} + \frac{1}{2}(R_w + RC_L)g h_R^{(0)2} & u_{x,R} u_{y,R} h_R^{(0)} \\ u_{x,R} u_{y,R} h_R^{(0)} & u_{y,R}^2 h_R^{(0)} + \frac{1}{2}\left(\frac{R_w+}{RC_R}\right)g h_R^{(0)2} \\ h_R^{(0)} u_{x,R} & h_R^{(0)} u_{y,R} \\ h_R^{(0)} u_{x,R} C_{k,R} & h_R^{(0)} u_{y,R} C_{k,R} \\ \vdots & \vdots \\ h_R^{(0)} u_{x,R} K_R & h_R^{(0)} u_{y,R} K_R \end{pmatrix}$$

$$\bar{f}_3 = \begin{pmatrix} u_{x,L}^2 h_R^{(0)} + (R_w + RC_R)g h_R^{(0)2} & u_{x,R} u_{y,R} h_R^{(0)} \\ u_{x,R} u_{y,R} h_R^{(0)} & u_{y,R}^2 h_R^{(0)} + (R_w + RC_R)g h_R^{(0)2} \\ u_{x,R} h_R^{(0)} & u_{y,R} h_R^{(0)} \\ u_{x,R} C_{k,R} h_R^{(0)} & u_{y,R} C_{k,R} h_R^{(0)} \\ \vdots & \vdots \\ u_{x,R} K_R h_R^{(0)} & u_{y,R} K_R h_R^{(0)} \end{pmatrix} \tag{B9}$$

$$\bar{f}_4 = \begin{pmatrix} \frac{1}{2}(R_w + RC_R)g h_R^{(0)2} & 0 \\ 0 & \frac{1}{2}(R_w + RC_R)g h_R^{(0)2} \\ 0 & 0 \\ 0 & 0 \\ \vdots & \vdots \\ 0 & 0 \end{pmatrix} \tag{B10}$$

$$\overline{U}_L^{(0)} = \begin{pmatrix} u_{x,L} h_L^{(0)} \\ u_{y,L} h_L^{(0)} \\ h_L^{(0)} \\ h_L^{(0)} C_{k,L} \\ \vdots \\ h_L^{(0)} K_L \end{pmatrix} \tag{B11}$$

$$\bar{g}_1 = \begin{pmatrix} u_{x,L} h_L^{(0)} \\ u_{y,L} h_L^{(0)} \\ h_L^{(0)} \\ C_{k,L} h_L^{(0)} \\ \vdots \\ K_L h_L^{(0)} \end{pmatrix} \tag{B12}$$

$$\overline{U}_R^{(0)} = \begin{pmatrix} u_{x,R} h_R^{(0)} \\ u_{y,R} h_R^{(0)} \\ h_R^{(0)} \\ h_R^{(0)} C_{k,R} \\ \vdots \\ h_R^{(0)} K_R \end{pmatrix} \tag{B13}$$

$$\bar{g}_2 = \begin{pmatrix} u_{x,R} h_R^{(0)} \\ u_{y,R} h_R^{(0)} \\ h_R^{(0)} \\ C_{k,R} h_R^{(0)} \\ \vdots \\ K_R h_R^{(0)} \end{pmatrix} \tag{B14}$$

Write $s_L$ and $s_R$ as $$s_L = s_L^{(0)} + c_{s1}\hat{\Delta}_L \hat{l} + c_{s2}\hat{\Delta}_R \hat{l} + c_{s3}\hat{\Delta}_L^2 \hat{l}^2 + c_{s4}\hat{\Delta}_R^2 \hat{l}^2 + c_{s9}\hat{\Delta}_L \hat{\Delta}_R \hat{l}^2 \tag{B15}$$

$$s_R = s_R^{(0)} + c_{s5}\hat{\Delta}_L \hat{l} + c_{s6}\hat{\Delta}_R \hat{l} + c_{s7}\hat{\Delta}_L^2 \hat{l}^2 + c_{s8}\hat{\Delta}_R^2 \hat{l}^2 + c_{s10}\hat{\Delta}_L \hat{\Delta}_R \hat{l}^2. \tag{B16}$$

The expressions for the expansion coefficients in above equations are shown below.

Substituting equations (23) and (24) in equations (38) and (39) results in $$u^* = \frac{1}{2}(\bar{q}_L + \bar{q}_R)\cdot\bar{n} + \sqrt{(R_w + RC)g h_L^{(0)}}\left[1 + \frac{1}{2}\frac{\Delta_L \hat{l}}{h_L^{(0)}} - \frac{1}{8}\left(\frac{\Delta_L \hat{l}}{h_L^{(0)}}\right)^2\right] - \sqrt{(R_w + RC)g h_R^{(0)}}\left[1 + \frac{1}{2}\frac{\Delta_R \hat{l}}{h_R^{(0)}} - \frac{1}{8}\left(\frac{\Delta_R \hat{l}}{h_R^{(0)}}\right)^2\right] \tag{B17}$$

-continued $$\sqrt{(R_w + RC)gh^*} = \frac{1}{2}\sqrt{(R_w + RC)gh_L^{(0)}}\left[1 + \frac{1}{2}\frac{\Delta_L \hat{l}}{h_L^{(0)}} - \frac{1}{8}\left(\frac{\Delta_L \hat{l}}{h_L^{(0)}}\right)^2\right] + \quad \text{(B18)}$$

$$\frac{1}{2}\sqrt{(R_w + RC)gh_R^{(0)}}\left[1 + \frac{1}{2}\frac{\Delta_R \hat{l}}{h_R^{(0)}} - \frac{1}{8}\left(\frac{\Delta_R \hat{l}}{h_R^{(0)}}\right)^2\right] + \frac{1}{4}(\bar{q}_L - \bar{q}_R)\cdot\bar{n}$$

The next step is to use the results in the above equations and compare values of the following expressions $$\bar{q}_L \cdot \bar{n} - \sqrt{(R_w + RC)gh_L} = \bar{q}_L \cdot \bar{n} - \sqrt{(R_w + RC)gh_L^{(0)}} - \quad \text{(B19)}$$

$$\frac{\sqrt{(R_w + RC)gh_L^{(0)}}}{2h_L^{(0)}}\Delta_L \hat{l} + \frac{1}{8}\frac{\sqrt{(R_w + RC)gh_L^{(0)}}}{h_L^{(0)2}}\Delta_L^2 \hat{l}^2$$

and $$u^\wedge - \sqrt{(R_w + RC)gh^*} = \quad \text{(B20)}$$
$$\left(\frac{1}{4}\bar{q}_L + \frac{3}{4}\bar{q}_R\right)\cdot\bar{n} + \frac{1}{2}\sqrt{(R_w + RC)gh_L^{(0)}} - \frac{3}{2}\sqrt{(R_w + RC)gh_R^{(0)}} +$$

$$\frac{1}{4}\frac{\sqrt{(R_w + RC)gh_L^{(0)}}}{h_L^{(0)}}\Delta_L \hat{l} - \frac{3}{4}\frac{\sqrt{(R_w + RC)gh_R^{(0)}}}{h_R^{(0)}}\Delta_R \hat{l} -$$

$$\frac{1}{16}\frac{\sqrt{(R_w + RC)gh_L^{(0)}}}{h_L^{(0)2}}\Delta_L^2 \hat{l}^2 + \frac{3}{16}\frac{\sqrt{(R_w + RC)gh_R^{(0)}}}{h_g^{(0)2}}\Delta_R^2 \hat{l}^2$$

at $\hat{l}=0$. If the value of the expression shown in equation (B19) at $\hat{l}=0$ is less than the value of the expression shown in equation (B20) at $\hat{l}=0$, then $s_L$ will be evaluated using that equation and the expansion coefficients for $s_L$ are $$c_{x1} = -\frac{\sqrt{(R_w + RC)gh_L^{(0)}}}{2} \quad \text{(B21)}$$

$$c_{x2} = 0 \quad \text{(B22)}$$

$$c_{x3} = \frac{1}{8}\sqrt{(R_w + RC)gh_L^{(0)}} \quad \text{(B23)}$$

$$c_{x4} = 0 \quad \text{(B24)}$$

$$c_{x5} = 0 \quad \text{(B25)}$$

with $$s_L^{(0)} = \bar{q}_L \cdot \bar{n} - \sqrt{(R_w + RC)gh_L^{(0)}} \quad \text{(B26)}$$

Otherwise $$c_{x1} = \frac{1}{4}\sqrt{(R_w + RC)gh_L^{(0)}} \quad \text{(B27)}$$

$$c_{x2} = -\frac{3}{4}\sqrt{(R_w + RC)gh_R^{(0)}} \quad \text{(B28)}$$

$$c_{x3} = -\frac{1}{16}\sqrt{(R_w + RC)gh_L^{(0)}} \quad \text{(B29)}$$

$$c_{x4} = \frac{3}{16}\sqrt{(R_w + RC)gh_R^{(0)}} \quad \text{(B30)}$$

$$c_{x5} = 0 \quad \text{(B31)}$$

with $$s_L^{(0)} = \left(\frac{1}{4}\bar{q}_L + \frac{3}{4}\bar{q}_R\right)\cdot\bar{n} + \frac{1}{2}\sqrt{(R_w + RC)gh_L^{(0)}} - \frac{3}{2}\sqrt{(R_w + RC)gh_R^{(0)}}. \quad \text{(B32)}$$

Similarly for $s_R$, the following expressions $$\bar{q}_R \cdot \bar{n} + \sqrt{(R_w + RC)gh_R} = \bar{q}_R \cdot \bar{n} + \sqrt{(R_w + RC)gh_R^{(0)}} + \quad \text{(B33)}$$

$$\frac{\sqrt{(R_w + RC)gh_R^{(0)}}}{2h_R^{(0)}}\Delta_R \hat{l} - \frac{1}{8}\frac{\sqrt{(R_w + RC)gh_R^{(0)}}}{h_R^{(0)2}}\Delta_R^2 \hat{l}^2 \text{ and}$$

$$u^\wedge + \sqrt{(R_w + RC)gh^*} = \quad \text{(B34)}$$
$$\left(\frac{3}{4}\bar{q}_L + \frac{1}{4}\bar{q}_R\right)\cdot\bar{n} + \frac{3}{2}\sqrt{(R_w + RC)gh_L^{(0)}} - \frac{1}{2}\sqrt{(R_w + RC)gh_R^{(0)}} +$$

$$\frac{3}{4}\frac{\sqrt{(R_w + RC)gh_L^{(0)}}}{h_L^{(0)}}\Delta_L \hat{l} - \frac{1}{4}\frac{\sqrt{(R_w + RC)gh_R^{(0)}}}{h_R^{(0)}}\Delta_R \hat{l} -$$

$$\frac{3}{16}\frac{\sqrt{(R_w + RC)gh_L^{(0)}}}{h_L^{(0)2}}\Delta_L^2 \hat{l}^2 + \frac{1}{16}\frac{\sqrt{(R_w + RC)gh_R^{(0)}}}{h_R^{(0)2}}\Delta_R^2 \hat{l}^2$$

are first evaluated. If the value of the expression shown in equation (B33) is less than the value of the expression shown in equation (B34), then $s_R$ will be evaluated using that equation and the expansion coefficients for $s_R$ are $$c_{x5} = 0 \quad \text{(B35)}$$

$$c_{x6} = \frac{\sqrt{(R_w + RC)gh_R^{(0)}}}{2} \quad \text{(B36)}$$

$$c_{x7} = 0 \quad \text{(B37)}$$

$$c_{x8} = -\frac{1}{8}\sqrt{(R_w + RC)gh_R^{(0)}} \quad \text{(B38)}$$

$$c_{x10} = 0 \quad \text{(B39)}$$

with $$s_R^{(0)} = \bar{q}_R \cdot \bar{n} + \sqrt{(R_w + RC)gh_R^{(0)}} \quad \text{(B40)}$$

Otherwise $$c_{x5} = \frac{3}{4}\sqrt{(R_w + RC)gh_L^{(0)}} \quad \text{(B41)}$$

$$c_{x6} = -\frac{1}{4}\sqrt{(R_w + RC)gh_R^{(0)}} \quad \text{(B42)}$$

$$c_{x7} = -\frac{3}{16}\sqrt{(R_w + RC)gh_L^{(0)}} \quad \text{(B43)}$$

$$c_{x8} = \frac{1}{16}\sqrt{(R_w + RC)gh_R^{(0)}} \quad \text{(B44)}$$

$$c_{x10} = 0 \quad \text{(B45)}$$

with $$s_R^{(0)} = \left(\frac{3}{4}\bar{q}_L + \frac{1}{4}\bar{q}_R\right)\cdot\bar{n} + \frac{3}{2}\sqrt{(R_w + RC)gh_L^{(0)}} - \frac{1}{2}\sqrt{(R_w + RC)gh_R^{(0)}}. \quad \text{(B46)}$$

Substituting equations (B1)-(B4) and equations (B15) and (B16) into equation (33), and retaining only terms of order $o(1)$, $o(\hat{\Delta}_L)$, $o(\hat{\Delta}_R)$, $o(\hat{\Delta}_L^2)$, $o(\hat{\Delta}_R^2)$, $o(\hat{\Delta}_L\hat{\Delta}_R)$, we obtain $$\bar{F}^* \cdot \bar{n} = \frac{s_R \overline{FG}_L \cdot \bar{n} - s_L \overline{FG}_R \cdot \bar{n} + s_L s_R (\overline{U}_R - \overline{U}_L)}{s_R - s_L} \quad \text{(B47)}$$

$$= \bar{f}^{*(0)} + \bar{f}_1^* \hat{\Delta}_L \hat{l} + \bar{f}_2^* \hat{\Delta}_R \hat{l} + \bar{f}_3^* \hat{\Delta}_L^2 \hat{l}^2 + \bar{f}_4^* \hat{\Delta}_R^2 \hat{l}^2 + \bar{f}_5^* \hat{\Delta}_L \hat{\Delta}_R \hat{l}^2$$

where the coefficients are given by the following equations $$\bar{f}^{*(0)} = a_{s0} \bar{e}_0 \quad \text{(B48)}$$

$$\bar{f}_1^* = a_{s0} \bar{e}_1 + a_{s1} \bar{e}_0 \quad \text{(B49)}$$

$$\bar{f}_2^* = a_{s0} \bar{e}_2 + a_{s2} \bar{e}_0 \quad \text{(B50)}$$

$$\bar{f}_3^* = a_{s0} \bar{e}_3 + a_{s1} \bar{e}_1 + a_{s3} \bar{e}_0 \quad \text{(B51)}$$

$$\bar{f}_4^* = a_{s0} \bar{e}_4 + a_{s2} \bar{e}_2 + a_{s4} \bar{e}_0 \quad \text{(B52)}$$

$$\bar{f}_5^* = a_{s0} \bar{e}_5 + a_{s1} \bar{e}_2 + a_{s2} \bar{e}_1 + a_{s5} \bar{e}_0 \quad \text{(B53)}$$

In the above equations, the coefficients $a_{s0}$, $a_{s1}$, $a_{s2}$, $a_{s3}$, $a_{s4}$, $a_{s5}$ and the coefficients $\bar{e}_0$, $\bar{e}_1$, $\bar{e}_2$, $\bar{e}_3$, $\bar{e}_4$, $\bar{e}_5$ are given by equations $$a_{x0} = (s_R^{(0)} - s_L^{\square})^{-1} \quad \text{(B54)}$$

$$a_{x1} = -\frac{(c_{s5} - c_{s1})}{(s_R^{(0)} - s_L^{(0)})^2} \quad \text{(B55)}$$

$$a_{x2} = -\frac{(c_{s6} - c_{s2})}{(s_R^{(0)} - s_L^{(0)})^2} \quad \text{(B56)}$$

$$a_{x3} = \frac{(c_{x5} - c_{\square})^2}{(s_R^{(0)} - s_L^{(0)})^2} - \frac{(c_{s7} - c_{s3})}{(s_R^{(0)} - s_L^{(0)})^2} \quad \text{(B57)}$$

$$a_{x4} = \frac{(c_{x6} - c_{\square})^2}{(s_R^{(0)} - s_L^{(0)})^2} - \frac{(c_{s8} - c_{\square})}{(s_R^{(0)} - s_L^{(0)})^2} \quad \text{(B58)}$$

$$a_{x5} = \frac{2(c_{s6} - c_{s2})(c_{s5} - c_{s1})}{(s_R^{(0)} - s_L^{(0)})^3} - \frac{(c_{s10} - c_{s9})}{(s_R^{(0)} - s_L^{(0)})^2} \quad \text{(B59)}$$

$$\bar{e}_0 = \left(s_R^{(i)} \overline{FG}_L^{(0)} - s_L^{(0)} \overline{FG}_R^{(0)}\right) \cdot \bar{n} + \bar{d}_0 \quad \text{(B60)}$$

$$\bar{e}_1 = \left(c_{x5} \overline{FG}_L^{(0)} - c_{\square} \overline{FG}_R^{(0)} + s_R^{(0)} \bar{f}_1\right) \cdot \bar{n} + \bar{d}_1 \quad \text{(B61)}$$

$$\bar{e}_2 = (c_{s6} \overline{FG}_L^{(0)} - c_{s2} \overline{FG}_R^{(0)} - s_L^{(0)} \bar{f}_3) \cdot \bar{n} + \bar{d}_2 \quad \text{(B62)}$$

$$\bar{e}_3 = (c_{s7} \overline{FG}_L^{(0)} - c_{s3} \overline{FG}_R^{(0)} + c_{s5} \bar{f}_1 + s_R^{(0)} \bar{f}_2) \cdot \bar{n} + \bar{d}_3 \quad \text{(B63)}$$

$$\bar{e}_4 = (c_{s8} \overline{FG}_L^{(0)} - c_{s4} \overline{FG}_R^{(0)} - c_{s2} \bar{f}_3 - s_L^{(0)} \bar{f}_4) \cdot \bar{n} + \bar{d}_4 \quad \text{(B64)}$$

$$\bar{e}_5 = (c_{s10} \overline{FG}_L^{(0)} - c_{s9} \overline{FG}_R^{(0)} + c_{s6} \bar{f}_1 - c_{s1} \bar{f}_3) \cdot \bar{n} + \bar{d}_5 \quad \text{(B65)}$$

where $$\bar{d}_0 = s_L^{(0)} s_R^{(0)} (\overline{U}_R^{(0)} - \overline{U}_L^{(0)}) \quad \text{(B66)}$$

$$\bar{d}_1 = (c_{s1} s_R^{(0)} + c_{s5} s_L^{(0)})(\overline{U}_R^{(0)} - \overline{U}_L^{(0)}) - s_L^{(0)} s_R^{(0)} \bar{g}_1 \quad \text{(B67)}$$

$$\bar{d}_2 = (c_{s2} s_R^{(0)} + c_{s6} s_L^{(0)})(\overline{U}_R^{(0)} - \overline{U}_L^{(0)}) + s_L^{(0)} s_R^{(0)} \bar{g}_2 \quad \text{(B68)}$$

$$\bar{d}_3 = (c_{s3} s_R^{(0)} + c_{s7} s_L^{(0)} + c_{s1} c_{s5})(\overline{U}_R^{(0)} - \overline{U}_L^{(0)}) - \bar{g}_1 (c_{s1} s_R^{(0)} + c_{s5} s_L^{(0)}) \quad \text{(B69)}$$

$$\bar{d}_4 = (c_{s4} s_R^{(0)} + c_{s8} s_L^{(0)} + c_{s2} c_{s6})(\overline{U}_R^{(0)} - \overline{U}_L^{(0)}) + \bar{g}_2 (c_{s2} s_R^{(0)} + c_{s6} s_L^{(0)}) \quad \text{(B70)}$$

$$\bar{d}_5 = (c_{s9} s_R^{(0)} + c_{s10} s_L^{(0)} + c_{s2} c_{s5} + c_{s1} c_{s6})(\overline{U}_R^{(0)} - \overline{U}_L^{(0)}) - \bar{g}_1 (c_{s2} s_R^{(0)} + c_{s6} s_L^{(0)}) + \bar{g}_2 (c_{s1} s_R^{(0)} + c_{s5} s_L^{(0)}) \quad \text{(B71)}$$

APPENDIX C

Calculations of the source term related to the gravitational forces.

The integration of the first term in the right-hand side of equation (13) can be written as $$\int_\Omega \bar{S}_g \, dx \, dy = \sum_i \int_{\Omega_i} \bar{S}_g \, dx \, dy \quad \text{(C1)}$$

$$= \begin{pmatrix} \sum_i \int_{\Omega_i} -(R_w + RC) gh \frac{\partial z}{\partial x} dx dy \\ \sum_i \int_{\Omega_i} -(R_w + RC) gh \frac{\partial z}{\partial y} dx dy \\ 0 \\ 0 \\ 0 \\ 0 \end{pmatrix}$$

$$= \begin{pmatrix} \sum_i S_{\eta x}^{(i)} \int_{\Omega_i} -(R_w + RC) gh \, dx dy \\ \sum_i S_{\eta y}^{(i)} \int_{\Omega_i} -(R_w + RC) gh \, dx dy \\ 0 \\ 0 \\ 0 \\ 0 \end{pmatrix}$$

$$= \begin{pmatrix} \sum_i -S_{\eta x}^{(i)} (R_w + RC) V_{\Omega_i} \\ \sum_i -S_{\eta y}^{(i)} (R_w + RC) V_{\Omega_i} \\ 0 \\ 0 \\ 0 \\ 0 \end{pmatrix}$$

where $V_{\Omega_i}$ is the fluid volume on top of the triangle $\Omega_i$. It can be calculated as $$V_{\Omega_i} = \int_{\Omega_i} h \, dx \, dy \quad \text{(C2)}$$

$$= \int_{\Omega_i} (\xi - z) \, dx \, dy$$

$$= \int_{\Omega_i} [\bar{\xi} + S_{\xi x}(x - x_c) + S_{\xi y}(y - y_c) - z_c - S_{\eta x}^{(i)}(x - x_c) - S_{\eta y}^{(i)}(y - y_c)] \, dx \, dy$$

$$= \int_{\Omega_i} [\bar{\xi} - z_c] \, dx \, dy + \int_{\Omega_i} (S_{\xi x} - S_{\eta x}^{(i)})(x - x_c) \, dx \, dy + \int_{\Omega_i} (S_{\xi y} - S_{\eta y}^{(i)})(y - y_c) \, dx \, dy$$

$$= (\bar{\xi} - z_c) A_{\Omega_i} + (S_{\xi x} - S_{\eta x}^{(i)})(x_c^{(i)} - x_c) A_{\Omega_i} + (S_{\xi y} - S_{\eta y}^{(i)})(y_c^{(i)} - y_c) A_{\Omega_i}$$

Substituting $V_{\Omega_i}$ in equation (C1) with equation (C2), the final results of the integration can be obtained.

What is claimed is:

1. A method of enhancing a geologic model of a subsurface region, comprising:
    (a) obtaining a bed topography of the subsurface region, the bed topography defined by a plurality of cells in a computer system, each of the plurality of cells having an elevation associated with its cell center;
    (b) representing the bed topography as a cell-centered piecewise constant representation based on the elevations associated with the plurality of cells;
    (c) reconstructing the bed topography to produce a spatially continuous surface;
    (d) calculating, with the computer system, flux and gravitational force-related source terms based on the reconstructed bed topography;
    (e) calculating fluxes between at least two of the cells, with the computer system, taking into account variations of the bed topography across a face between the at least two of the cells;
    (f) predicting at least one of fluid flow, deposition of sediments onto the bed, and erosion of sediments from the bed using the fluxes and gravitational force-related source terms;
    (g) inputting the predicted at least one of fluid flow, deposition and erosion into the geologic model of the subsurface region;
    (h) using the geologic model to predict characteristics of the subsurface region;
    (i) outputting the predicted characteristics of the subsurface region; and
    (j) extracting hydrocarbons based on the outputted predicted characteristics of the subsurface region.

2. The method recited in claim 1, wherein the fluxes are calculated to at least a first order of accuracy.

3. The method recited in claim 1, wherein reconstructing the bed topography comprises defining triangles by pairs of two consecutive cell vertices and an effective cell center.

4. The method recited in claim 1, further comprising:
    reconstructing a fluid surface elevation; and
    calculating flux and gravitational force-related source terms based on the reconstructed bed topography and the reconstructed fluid surface elevation.

5. The method recited in claim 4, wherein the fluid surface elevation is reconstructed using a piecewise constant scheme.

6. The method recited in claim 4, wherein the fluid surface elevation is reconstructed using a piecewise linear scheme.

7. The method recited in claim 1, wherein outputting the predicted characteristics of the subsurface region comprises displaying the predicted characteristics.

8. The method recited in claim 1, wherein reconstructing the bed topography conserves mass below and above the spatially continuous surface.

9. The method recited in claim 1, further comprising:
    updating piecewise constant cell elevations using the predicted one of fluid flow, deposition of sediments and erosion of sediments; and
    repeating steps (a) through (f) to improve accuracy of fluid flow predictions.

10. The method recited in claim 1, wherein the predicted characteristics of the subsurface region include at least one of sediment grain size distribution, porosity and permeability.

11. The method recited in claim 1, wherein the plurality of elevations represent conservative variables, and further comprising updating the conservative variables based on the calculated source terms.

12. A computer program product having computer executable logic recorded on a tangible, non-transitory, machine-readable medium, the computer program product comprising:
    code for obtaining a bed topography of a subsurface region, the bed topography defined by a plurality of cells, each of the plurality of cells having an elevation associated with its cell center;
    code for representing the bed topography as a cell-centered piecewise constant representation based on the elevations associated with the plurality of cells;
    code for reconstructing the bed topography to produce a spatially continuous surface;
    code for calculating flux and gravitational force-related source terms based on the reconstructed bed topography;
    code for calculating fluxes between at least two of the cells, taking into account variations of the bed topography across a face between the at least two of the cells;
    code for predicting at least one of fluid flow, deposition of sediments onto the bed, and erosion of sediments from the bed using the fluxes and gravitational force-related source terms; and
    code for managing production of hydrocarbon resources based on the prediction of the at least one of fluid flow, deposition of sediments onto the bed, and erosion of sediments from the bed.

13. The computer program product recited in claim 12, wherein the fluxes are calculated to at least a first order of accuracy.

14. The computer program product recited in claim 12, wherein the code for reconstructing the bed topography comprises code for defining triangles by pairs of two consecutive cell vertices and an effective cell center.

15. The computer program product recited in claim 12, further comprising:
    code for reconstructing a fluid surface elevation above the bed topography; and
    code for calculating flux and gravitational force-related source terms based on the reconstructed bed topography and the reconstructed fluid surface elevation.

16. The computer program product recited in claim 12, further comprising outputting the predicted fluid flow, the deposition of sediments, or the erosion of sediments.

17. The computer program product recited in claim 12, further comprising:
    code for inputting the predicted at least one of fluid flow, deposition and erosion into a geologic model of the subsurface region;
    code for predicting characteristics of the subsurface region using the geologic model; and
    code for outputting the predicted characteristics of the subsurface region.

18. A method of extracting hydrocarbons from a subsurface region, the method comprising:
    obtaining a bed topography of the subsurface region, the bed topography defined by a plurality of cells, each of the plurality of cells having an elevation associated with its cell center;
    representing the bed topography as a cell-centered piecewise constant representation based on the plurality of elevations associated with the plurality of cells;
    reconstructing the bed topography to produce a spatially continuous surface;
    calculating flux and gravitational force-related source terms based on the reconstructed bed topography;

calculating fluxes between at least two of the cells taking into account variations of the bed topography across a face between the at least two of the cells;
predicting at least one of fluid flow, deposition of sediments onto the bed, and erosion of sediments from the bed using the fluxes and gravitational force-related source terms;
predicting hydrocarbon presence in the subsurface region based at least in part on the predicted fluid flow, deposition of sediments, or erosion of sediments; and
extracting hydrocarbons from the subsurface region based on the predicted hydrocarbon presence in the subsurface region.

* * * * *